US008283669B2

(12) United States Patent
Ohnuma

(10) Patent No.: US 8,283,669 B2
(45) Date of Patent: Oct. 9, 2012

(54) SEMICONDUCTOR DEVICE AND METHOD OF MANUFACTURING SAME

(75) Inventor: Hideto Ohnuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/963,883

(22) Filed: Dec. 9, 2010

(65) Prior Publication Data

US 2011/0084338 A1 Apr. 14, 2011

Related U.S. Application Data

(62) Division of application No. 11/949,170, filed on Dec. 3, 2007, now Pat. No. 7,851,277.

(30) Foreign Application Priority Data

Dec. 5, 2006 (JP) ................................ 2006-328015

(51) Int. Cl.
*H01L 29/04* (2006.01)
(52) U.S. Cl. ................ 257/59; 257/52; 257/55; 257/65; 257/347; 257/E29.151; 257/E29.297
(58) Field of Classification Search ............... 257/52, 257/55, 59, 65, 347, E29.151, E29.297
See application file for complete search history.

(56) References Cited

U.S. PATENT DOCUMENTS

| | | |
|---|---|---|
| 5,650,339 A | 7/1997 | Saito et al. |
| 5,652,453 A | 7/1997 | Iwamatsu et al. |
| 5,725,753 A | 3/1998 | Harada et al. |
| 5,773,330 A | 6/1998 | Park |
| 6,030,873 A | 2/2000 | Iwamatsu et al. |
| 6,087,698 A | 7/2000 | Saito et al. |
| 6,104,065 A | 8/2000 | Park |
| 6,118,151 A | 9/2000 | Tsutsu |
| 6,124,153 A | 9/2000 | Lee et al. |
| 6,221,788 B1 | 4/2001 | Kobayashi et al. |
| 6,228,692 B1 | 5/2001 | Tsutsu |
| 6,388,291 B1 | 5/2002 | Zhang et al. |
| 6,433,361 B1 | 8/2002 | Zhang et al. |
| 6,555,843 B1 | 4/2003 | Yamazaki et al. |
| 6,876,039 B2 | 4/2005 | Okihara |
| 2005/0116305 A1 | 6/2005 | Hwang et al. |
| 2005/0224796 A1 | 10/2005 | Zhang et al. |
| 2005/0280065 A1* | 12/2005 | Iwata et al. ................... 257/310 |
| 2006/0086934 A1 | 4/2006 | Iwamatsu et al. |

FOREIGN PATENT DOCUMENTS

| | | |
|---|---|---|
| EP | 0 532 314 A1 | 3/1993 |
| EP | 1 536 482 A1 | 6/2005 |
| JP | 59-150469 | 8/1984 |
| JP | 5-29625 | 2/1993 |

(Continued)

*Primary Examiner* — Long Tran
(74) *Attorney, Agent, or Firm* — Husch Blackwell LLP

(57) ABSTRACT

An object is to reduce the adverse influence which a portion of a gate insulating layer where the thickness has decreased, that is, a step portion, has on semiconductor element characteristics so that the reliability of the semiconductor element is improved. A semiconductor layer is formed over an insulating surface; a side surface of the semiconductor layer is oxidized using wet oxidation to form a first insulating layer; a second insulating layer is formed over the semiconductor layer and the first insulating layer; and a gate electrode is formed over the semiconductor layer and the first insulating layer with the second insulating layer interposed therebetween.

12 Claims, 24 Drawing Sheets

FOREIGN PATENT DOCUMENTS

| | | |
|---|---|---|
| JP | 5-175506 | 7/1993 |
| JP | 7-176753 | 7/1995 |
| JP | 7-321323 | 12/1995 |
| JP | 8-18055 | 1/1996 |
| JP | 8-213494 | 8/1996 |
| JP | 8-335702 | 12/1996 |
| JP | 9-17765 | 1/1997 |
| JP | 9-23010 | 1/1997 |
| JP | 9-36380 | 2/1997 |
| JP | 9-45679 | 2/1997 |
| JP | 11-258636 | 9/1999 |
| JP | 2002-76345 | 3/2002 |
| JP | 2003-203925 | 7/2003 |
| JP | 2005-19859 | 1/2005 |
| JP | 2005-167207 | 6/2005 |

* cited by examiner

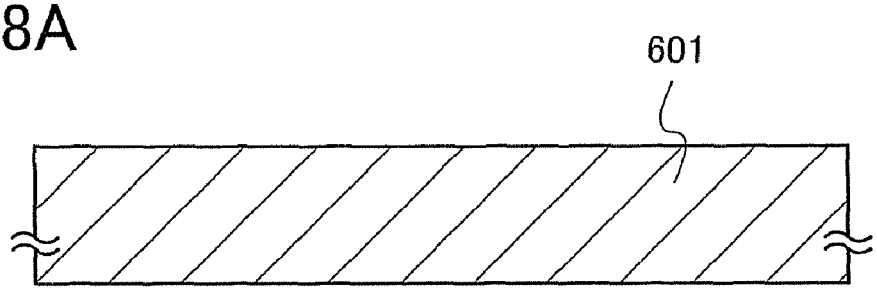
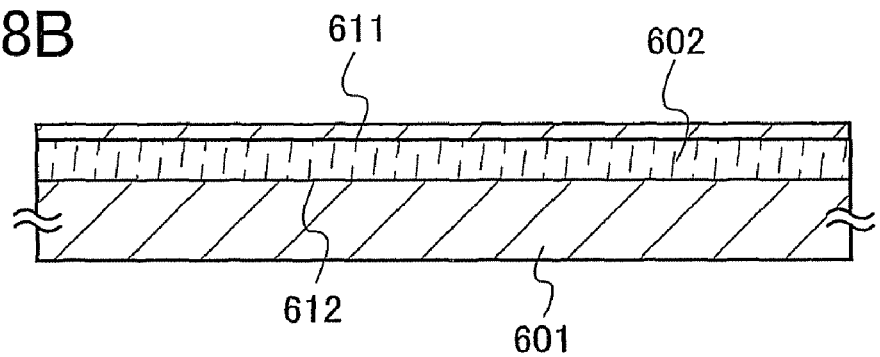
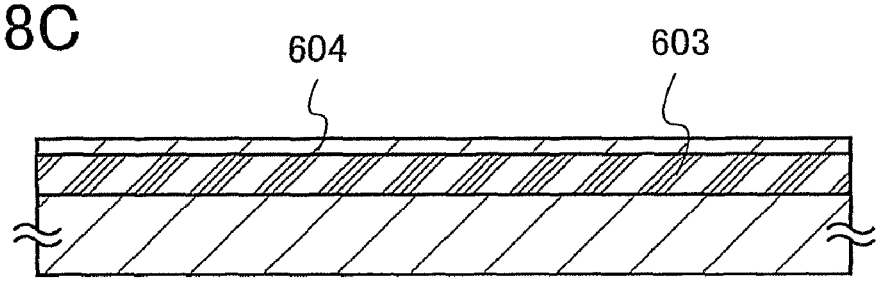
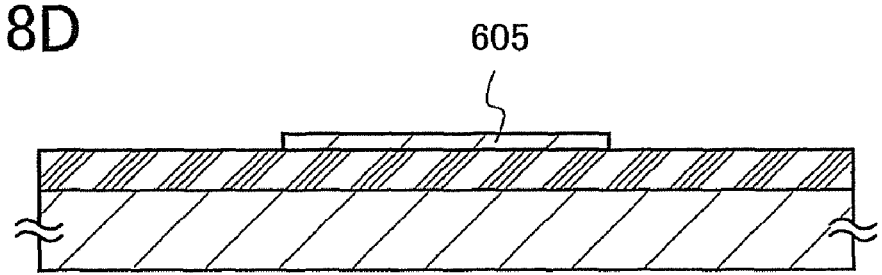

"0" writing

"1" writing

Erasing

Reading

SEMICONDUCTOR DEVICE AND METHOD OF MANUFACTURING SAME

This application is a divisional of application Ser. No. 11/949,170 filed on Dec. 3, 2007 now U.S. Pat. No. 7,851,277.

BACKGROUND OF THE INVENTION

1. Field of the Invention

The present invention relates to semiconductor devices and to methods of manufacturing semiconductor devices.

2. Description of the Related Art

In recent years, there has been extensive production of semiconductor devices in which a thin film transistor (a TFT) is formed over a substrate, such as a glass substrate, which has an insulating surface, and used as a switching element or the like. Over a substrate having an insulating surface, an island-shaped semiconductor layer is formed using a CVD method, a photolithography process, or the like, and the thin film transistor is provided such that part of the island-shaped semiconductor layer is used as a channel forming region of the transistor (for example, see Reference 1: Japanese Published Patent Application No. H08-018055).

Schematic diagrams of a common thin film transistor are shown in FIGS. 24A to 24D. FIG. 24A shows a top view of a thin film transistor. FIG. 24B shows a cross section taken along the broken line joining A1 and B1 in FIG. 24A. FIG. 24C shows a cross section taken along the broken line joining A2 and B2 in FIG. 24A. FIG. 24D shows an enlarged view of an end portion 25 of a semiconductor layer 32 in FIG. 24C. As shown in FIGS. 24B to 24D, in the thin film transistor, an insulating layer 31 which serves as a base film is formed over a substrate 30; the semiconductor layer 32, which includes a channel forming region 32a and impurity regions 32b and 32c which serve as a source region and a drain region, is formed over the insulating layer 31; an insulating layer 33 which serves as a gate insulating layer is formed over the semiconductor layer 32 and the insulating layer 31; and a conductive layer 34 which serves as a gate electrode is formed over the insulating layer 33.

In FIGS. 24A to 24D, when the insulating layer 33 which serves as a gate insulating layer is formed over the selectively etched semiconductor layer 32, the film thickness of the insulating layer 33 becomes uneven at the end portion 25 of the semiconductor layer 32, resulting in poor coverage. In a section where the film thickness of the insulating layer 33 is thin, the electric field strength of the gate voltage increases, and this adversely affects the withstand voltage and reliability of the thin film transistor.

Further, the stress of the substrate and of each thin film is concentrated at the end portion 25 of the semiconductor layer 32, and this causes variation in element characteristics.

In order to ameliorate the reduction in coverage by the gate insulating layer which is caused by a step at the end portion of the semiconductor layer 32, a method in which an end portion of an active layer is tapered is used (for example, see Reference 2: Japanese Published Patent Application No. 2005-167207).

Meanwhile, in thin film transistors included in circuits which require high-speed operation, it is preferable that a channel length is short and the gate insulating layer is thin. Therefore, the gate insulating layer has a small thickness of several tens of nanometers.

SUMMARY OF THE INVENTION

However, even when an end portion of the semiconductor layer is tapered, there is still concentration of the electric field and stress.

In short, even when an end portion of the semiconductor layer is tapered, the film thickness of the gate insulating layer becomes uneven at the end portion of the semiconductor layer, resulting in electric field concentration at a thin place in the gate insulating layer. Due to this electric field concentration, leak current increases, and therefore the power consumption of the device increases. Further, when excessive electric field concentration occurs, electrostatic breakdown of the gate insulating layer occurs, and thus gate leakage faults occur. Therefore, the gate withstand voltage decreases. These are significant problems particularly when the thickness of the gate insulating layer is decreased to several tens of nanometers.

The present invention is a technique for solving such problems. An object of the invention is to reduce an adverse effect on semiconductor device characteristics caused by a section where the gate insulating layer has a small thickness, that is, caused by unevenness of the thickness of the gate insulating layer in a step portion, and to improve the reliability of the semiconductor device.

A semiconductor device of the invention can be formed by: forming a semiconductor layer over an insulating surface; oxidizing an end portion (a side surface) of the semiconductor layer using wet oxidation to form a first insulating layer; forming a second insulating layer over the semiconductor layer and the first insulating layer; and Mulling a gate electrode over the semiconductor layer and the first insulating layer with the second insulating layer interposed therebetween.

Note that wet oxidation as referred to here means a process in which an aqueous solution containing ozone, an aqueous solution containing hydrogen peroxide, an aqueous solution containing sulfuric acid, an aqueous solution containing iodic acid, or an aqueous solution containing nitric acid is used to oxidize a surface of a semiconductor layer.

In the invention, an insulating layer is formed at an end portion (a side surface) of a channel forming region of a semiconductor layer. Therefore, the adverse effect on a semiconductor device of poor coverage of a surface of the semiconductor layer by a gate insulating layer can be reduced. In short, the side surface of the channel forming region of the semiconductor layer can be prevented from being in contact with the gate electrode.

Further, because an oxide film and a gate insulating layer are formed at an end portion of a semiconductor layer, effective film thickness can be made large, and thus electric field concentration at the end portion of the semiconductor layer can be reduced.

Further, at an end portion of a semiconductor layer in contact with an insulating layer which serves as a base film, a recess portion may form in the insulating layer. However, because an insulating layer can be selectively formed at the end portion of the semiconductor layer by using wet oxidation, even if a recess portion is formed in the base insulating layer, contact between the semiconductor layer and a gate electrode can be prevented.

Therefore, gate leakage faults can be reduced and the withstand voltage of a gate electrode can be improved. The invention is particularly effective in the case where the film thickness of an insulating layer which serves as a gate insulating layer is smaller than the thickness of a semiconductor layer; for example, in a case where the film thickness of the insulating layer which serves as a gate insulating layer is several nanometers to several tens of nanometers thick. By employing the invention, a semiconductor device with good reliability can be manufactured.

BRIEF DESCRIPTION OF THE DRAWINGS

FIGS. 8A to 8D are cross sections showing manufacturing process steps of a thin film transistor of the invention.

DETAILED DESCRIPTION OF THE INVENTION

Figure 1A:
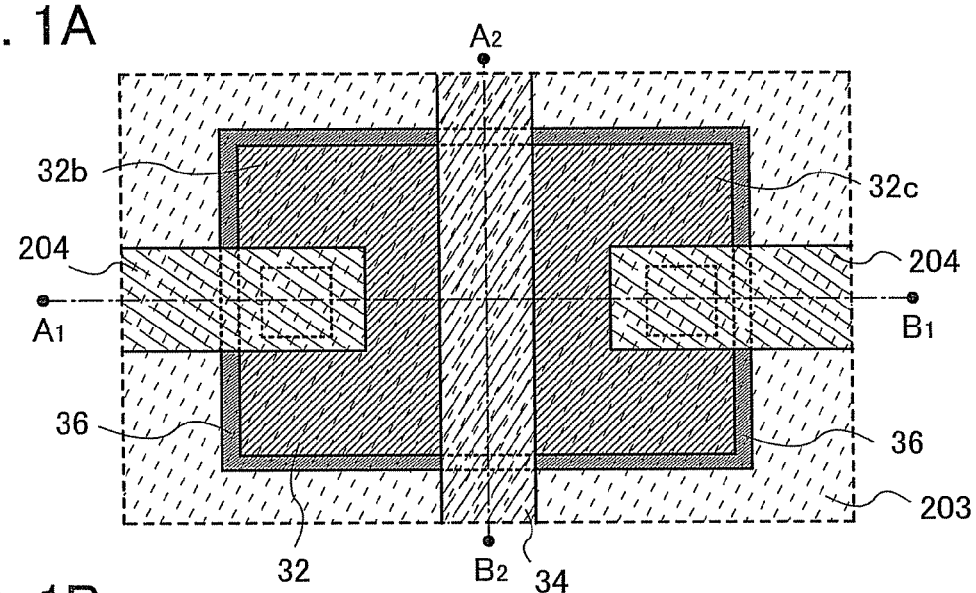
FIGS. 1A to 1C are a top view and cross sections of a structure of a thin film transistor of the invention.

Hereinafter, embodiment modes of the invention will be described with reference to the accompanying drawings. However, the invention is not limited to the description below, and those skilled in the art will appreciate that a variety of modifications can be made to the modes and details without departing from the spirit and scope of the invention. Accordingly, the invention should not be construed as being limited to the description of the embodiment modes below. Note that in the following description of structures of the invention, like reference numerals may be used to indicate like parts throughout the drawings.

Embodiment Mode 1

In this embodiment mode, a structure of a semiconductor device which can suppress leak current caused by a reduction in coverage by a gate insulating layer at an end portion of a semiconductor layer will be described.

Figure 1B:
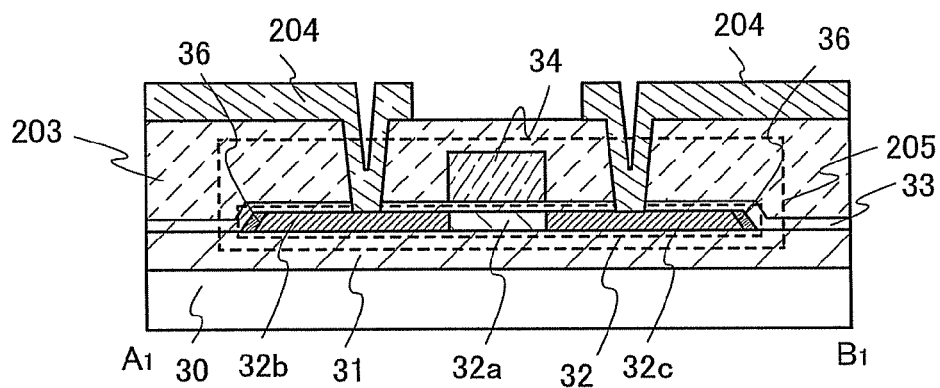
Figure 1C:
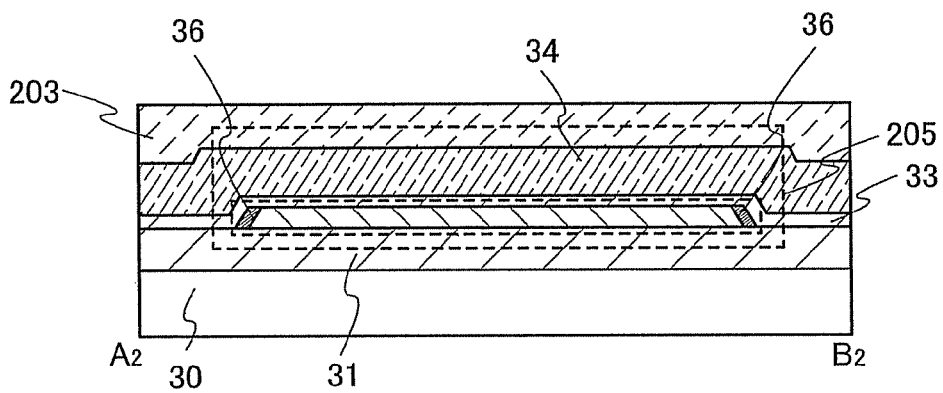

FIGS. 1A to 1C are a top view and cross sections which show a main structure of a semiconductor device of the invention. FIG. 1A is a top view which shows main parts of a thin film transistor. FIG. 1B shows a cross section taken along the broken line joining A1 and B1 in FIG. 1A. FIG. 1C shows a cross section taken along the broken line joining A2 and B2 in FIG. 1A.

A semiconductor device described in this embodiment mode includes a thin film transistor 205 having an island-shaped semiconductor layer 32 which is provided over a substrate 30 with an insulating layer 31 interposed therebetween and a conductive layer 34 which serves as a gate electrode which is provided over the semiconductor layer 32 with a gate insulating layer 33 interposed therebetween; an insulating layer 203 which covers the gate insulating layer 33 and the conductive layer 34; and a conductive layer 204 which serves as a source electrode or a drain electrode and is provided over the insulating layer 203 (FIGS. 1A to 1C). The semiconductor layer 32 includes a channel forming region 32a and impurity regions 32b and 32c which each serve as a source region or a drain region. An insulating layer 36 is formed at an end portion (a side surface) of the semiconductor layer 32, which here is a section which is in contact with the channel forming region 32a below the conductive layer 34. Further, an impurity which has a conductivity type opposite to that of an impurity added to the impurity regions 32b and 32c may be added to the channel forming region 32a.

In this embodiment mode, the insulating layer 36 is an oxide film formed by oxidizing the semiconductor layer 32. Further, the insulating layer 36, which is formed at the end portion of the semiconductor layer, is provided to prevent a short circuit between the end portion of the semiconductor layer 32 and the conductive layer 34 which serves as a gate electrode and thus to prevent leak current from flowing. Therefore, the insulating layer 36 is formed at least at a side surface (an exposed section) of the channel forming region 32a of the semiconductor layer 32. Note that the insulating layer 36 may of course also be formed at other sections.

In this embodiment mode, the island-shaped semiconductor layer 32 can be formed by forming a semiconductor layer over the insulating layer 31 which is formed over the substrate 30; selectively forming a resist over the semiconductor layer; and etching the semiconductor layer using the resist as a mask. Subsequently, the insulating layer 36 can be formed at an end portion of the semiconductor layer 32 by oxidizing the end portion of the semiconductor layer 32 using wet oxidation before removing the resist. Then, the resist is removed, the gate insulating layer 33 which covers the semiconductor layer 32 and the insulating layer 36 is formed, and the conductive layer 34 which serves as a gate electrode is formed over the gate insulating layer 33.

A method of forming the insulating layer 36 at an end portion of the semiconductor layer 32 using wet oxidation will now be described. For example, the insulating layer 36 formed using an oxide film can be formed at an exposed section of the semiconductor layer 32 by oxidizing a surface of the semiconductor layer 32 using an aqueous solution containing 5 ppm or more, preferably, 20 ppm or more, more preferably, 100 ppm or more, of ozone ($O_3$) (representatively, ozone water). Note that an aqueous solution containing hydrogen peroxide ($H_2O_2$), an aqueous solution containing sulfuric acid ($H_2SO_4$), an aqueous solution containing iodic acid ($HIO_3$), an aqueous solution containing nitric acid ($HNO_3$), or the like can be used instead of an aqueous solution containing ozone. Further, the aqueous solutions may include an organic acid, such as acetic acid or oxalic acid.

Note that in this specification, treatment such as that described above in which an aqueous solution is used to form an oxide film at an exposed section of the semiconductor layer 32 is referred to as wet oxidation.

Because the semiconductor device described in this embodiment mode includes the insulating layer 36 at an end portion (a side surface) of the channel forming region 32a of the semiconductor layer 32 which is below the gate electrode, an adverse effect on the semiconductor device caused by poor coverage of a surface of the semiconductor layer 32 by the gate insulating layer 33 can be reduced. That is, because the side surface of the channel forming region 32a of the semiconductor layer 32 is not in contact with the conductive layer 34 which serves as a gate electrode, gate leakage faults can be reduced and the withstand voltage of the gate electrode can be improved.

Further, in this embodiment mode, since oxidation can proceed from the exposed section which is the end portion of the semiconductor layer 32, an insulating film can be selectively formed thickly at the end portion of the semiconductor layer 32. Therefore, electric field concentration in the vicinity of the end portion of the semiconductor layer 32 can be reduced, gate leakage faults can be reduced, and the withstand voltage of the gate electrode can be improved.

Further, when the gate insulating layer 33 is formed of a material with a larger dielectric constant than that of the insulating layer 36 at the end portion of the semiconductor layer 32, even in the case where the gate insulating layer 33 and the insulating layer 36 are formed with a similar thickness, the effective thickness of the insulating layer at the end portion of the semiconductor layer 32 can be made larger than that of the gate insulating layer 33. Therefore, electric field concentration at the end portion of the semiconductor layer 32 can be reduced. Accordingly, gate leakage faults can be reduced, and the withstand voltage of the gate electrode can be improved.

As the gate insulating layer 33 formed of a material with a larger dielectric constant than that of the insulating layer 36 formed at the end portion of the semiconductor layer 32, a film which is a single layer or a stacked layer which includes a silicon oxide film, a silicon nitride film, a silicon oxynitride ($SiO_xN_y$, where x>y>0) film, a silicon nitride oxide ($SiN_xO_y$, where x>y>0) film, a Hf-based oxide film, or the like which is formed using a chemical vapor deposition method or a sputtering method, or the like can be used.

Note that in this embodiment mode, a silicon oxide film, a silicon nitride film, a silicon oxynitride ($SiO_xN_y$, where x>y>0) film, or a silicon nitride oxide ($SiN_xO_y$, where x>y>0) film which is formed on the surface of the semiconductor layer 32 by forming the semiconductor layer 32 and subsequently oxidizing the semiconductor layer 32 using wet oxidation, then performing a plasma treatment on the surface of the semiconductor layer 32 in an atmosphere which contains oxygen or an atmosphere which contains nitrogen, or the like can be used as the gate insulating layer 33.

Figure 11A:
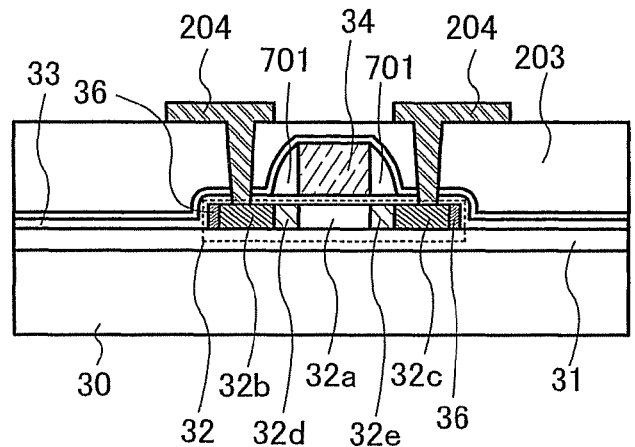
FIGS. 11A to 11C are cross sections of a structure of a thin film transistor of the invention.
Figure 11B:
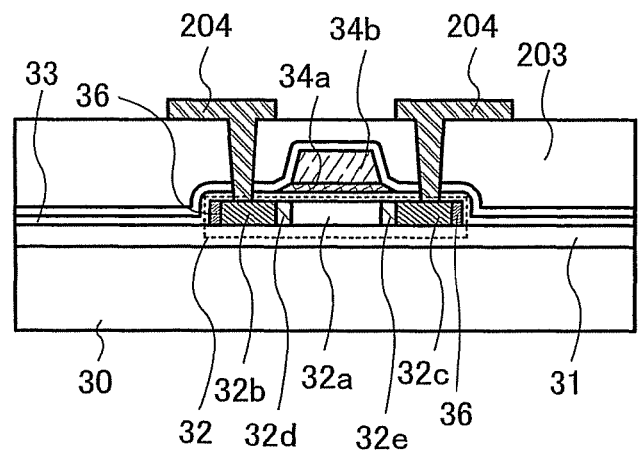
Figure 11C:
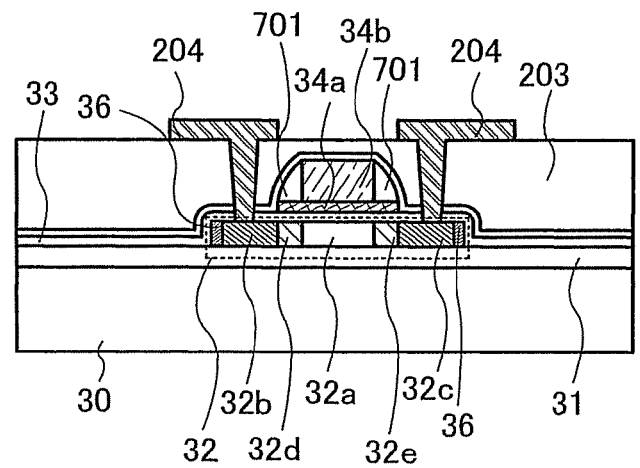

Note that the form of the thin film transistor is not limited to the one shown in FIGS. 1A to 1C. For example, a sidewall 701 formed from an insulator may be formed, such that it is in contact with a side surface of the conductive layer 34 which serves as a gate electrode. Further, low-concentration impurity regions (LDD regions) 32d and 32e, to which an impurity is added at a lower concentration than that of the impurity regions 32b and 32c, may be formed between the impurity regions 32b and 32c, which each serve as a source region or a drain region, and the channel forming region 32a (FIG. 11A). Further, the structure of the thin film transistor is not limited to that described above. A double-gate structure in which two channel forming regions are formed or a multi-gate structure such as a triple-gate structure in which three channel forming regions are formed can be used. Further, the gate electrode may have a stacked layer structure. For example, a structure may be employed in which the gate electrode has a two-layer structure which includes a first conductive layer 34a and a second conductive layer 34b which is formed over the first conductive layer 34a; the first conductive layer 34a is formed with a tapered shape; and the low-concentration impurity regions 32d and 32e are provided such that they only overlap with the first conductive layer 34a (FIG. 11B). Further, a structure may be employed in which the gate electrode includes the first conductive layer 34a and the second conductive layer 34b which is formed over the first conductive layer 34a, and the sidewall 701 is provided, such that it is in contact with a side surface of the second conductive layer 34b and is over the first conductive layer 34a (FIG. 11C). Further, the impurity regions 32b and 32c which each serve as a source region or a drain region can be formed from a silicide of Ni, Co, W, or the like.

Embodiment Mode 2

In this embodiment mode, an example of a method of manufacturing the semiconductor device shown in FIGS. 1A to 1C will be described with reference to the drawings. Note that in this embodiment mode, manufacturing process steps which relate to the cross section taken along the broken line joining A1 and B1 in FIG. 1A are described with reference to FIGS. 2A to 2D, and manufacturing process steps which relate to the cross section taken along the broken line joining A2 and B2 in FIG. 1A are described with reference to FIGS. 2E to 2H.

Figure 2A:
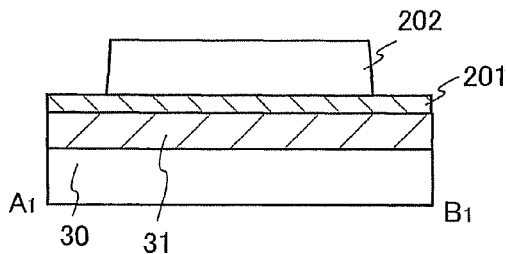
FIGS. 2A to 2H are cross sections of a structure of a thin film transistor of the invention.
Figure 2E:
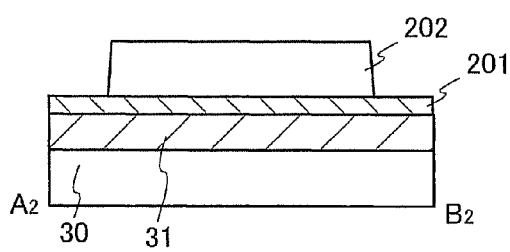

First, the insulating layer 31 is formed over the substrate 30 (FIGS. 2A and 2E).

As the substrate 30, a glass substrate, a quartz substrate, a metal substrate (for example, a stainless steel substrate or the like), a ceramic substrate, a semiconductor substrate, such as a Si substrate, or the like can be used. Alternatively, a plastic substrate formed of polyethylene terephthalate (PET), polyethylene naphthalate (PEN), polyether sulfone (PES), acrylic, or the like can be used.

The insulating layer 31 is a layer which prevents impurities such as alkali metals and the like from diffusing from the substrate 30 and contaminating an element which is formed thereover, and may be provided as appropriate as a blocking layer. For example, the insulating layer 31 can be formed of an insulating material, such as silicon oxide, silicon nitride, silicon oxynitride ($SiO_xN_y$, where x>y>0), silicon nitride oxide ($SiN_xO_y$, where x>y>0), using a CVD method, a sputtering method, or the like. For example, in a case where the insulating layer 31 is formed as a two-layer structure, a silicon nitride oxide film may be formed as a first insulating layer and a silicon oxynitride film may be formed as a second insulating layer. Alternatively, a silicon nitride film may be formed as the first insulating layer and a silicon oxide film may be formed as the second insulating layer.

Subsequently, a semiconductor layer 201 is formed over the insulating layer 31. The semiconductor layer 201 can be formed from an amorphous semiconductor film or a crystalline semiconductor film. As a crystalline semiconductor film, a film formed by crystallizing an amorphous semiconductor film formed over the insulating layer 31 using a heat treatment or laser light irradiation, or the like can be used. Note that silicon is preferable as a semiconductor material. Alternatively, silicon germanium or the like can be used.

The semiconductor layer 201 has a thickness of 10 to 200 nm, preferably, approximately 10 to 50 nm, more preferably, approximately 10 to 30 nm. Note that in the case of forming the semiconductor layer 201 with a thickness of 50 nm or less, the semiconductor layer 201 may be formed with a thickness of approximately 10 to 50 nm by forming a semiconductor layer with a thickness of 50 nm or more and then dry-etching a surface of the semiconductor layer. As an etching gas for the etching, a chlorine-based gas, such as $Cl_2$, $BCl_3$, or $SiCl_4$; a fluorine-based gas, such as $CF_4$, $NF_3$, $SF_6$, or $CHF_3$; a mixed gas, in which $O_2$ gas, $H_2$ gas, or an inert gas, such as He or Ar, is added as appropriate to a fluorine-based gas; or the like can be used. Note that before the dry etching is performed, the semiconductor layer surface may be treated with dilute hydrofluoric acid to remove a native oxide film formed on the semiconductor layer surface and then the semiconductor layer surface may be treated with ozone water or the like to form an oxide film on the semiconductor layer surface.

By forming the semiconductor layer 201 as a thin film with a thickness of approximately 50 nm or less, poor coverage by the gate insulating layer which is formed over the semiconductor layer surface can be reduced. Further, by forming the semiconductor layer 201 as a thin film, further miniaturization of a TFT can be achieved. Moreover, even when the amount of an impurity element with which a channel forming region is doped is increased in order to reduce the threshold voltage of a TFT, because it is easier to manufacture a complete depletion type TFT when the semiconductor layer 201 is formed as a thin film, a TFT with a good subthreshold swing and a small threshold voltage can be manufactured.

Further, when a film formed by crystallizing or recrystallizing an amorphous semiconductor film by laser light irradiation is used as the semiconductor layer 201, an LD-pumped continuous wave (CW) laser ($YVO_4$, second harmonic (wavelength of 532 nm)) can be used as a light source of the laser light. Although the wavelength is not specifically limited to the second harmonic, the second harmonic is superior to harmonics higher than that in terms of energy efficiency. When a semiconductor layer is irradiated with a CW laser, energy is continuously applied to the semiconductor layer. Therefore, once the semiconductor layer is converted to a molten state, the molten state can be maintained. Further, by scanning the semiconductor layer with a CW laser, a solid-liquid interface of the semiconductor layer can be moved, and crystal grains which are long in one direction, which matches the direction of the movement, can be formed. A reason for using a solid-state laser is that compared to a gas laser or the like, a solid-state laser has a more stable power output, so more stable treatment can be expected. Note that the laser light source is not limited to a CW laser. A pulsed laser with a repetition rate of 10 MHz or higher can also be used. When a pulsed laser with a high repetition rate is used, if a pulse interval of the laser is shorter than the time it takes for a semiconductor layer to solidify after being melted, the semiconductor layer can be maintained in a molten state, and by moving the solid-liquid interface, a semiconductor layer with crystal grains which are long in one direction can be formed. It is also possible to employ another type of CW laser or pulsed laser with a repetition rate of 10 MHz or higher. For example, a gas laser such as an Ar laser, a Kr laser, or a $CO_2$ laser can be used. A solid-state laser such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, or a $YVO_4$ laser can be used. Further, a ceramic laser such as a YAG laser, a $Y_2O_3$ laser, a $GdVO_4$ laser, or a $YVO_4$ laser can also be used. A metal vapor laser such as a helium-cadmium laser or the like can be used. It is preferable to emit laser light from a laser oscillator using $TEM_{00}$ (single transverse mode), since by doing so, the energy uniformity of a linear beam spot obtained on a surface that is irradiated can be increased. Further, a pulsed excimer laser can also be used.

Figure 2B:
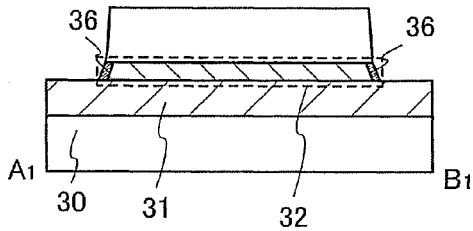
Figure 2F:
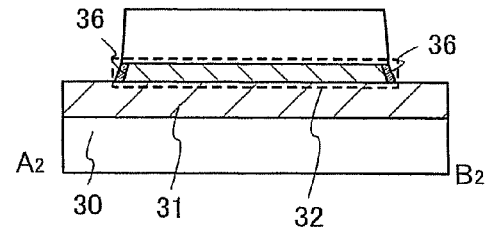

Next, a resist 202 is selectively formed over the semiconductor layer 201 (FIGS. 2A and 2E). Note that the resist may be formed subsequent to forming an oxide film over the semiconductor layer. Then, the resist 202 is used as a mask and the semiconductor layer 201 is dry-etched to form the island-shaped semiconductor layer 32 (FIGS. 2B and 2F). Note that the resist 202 is used as a mask during etching, and a positive photoresist, a negative photoresist, or the like can be selected as appropriate and used for the resist 202.

As an etching gas for the dry etching, a fluorine-based gas, such as $CF_4$, $NF_3$, $SF_6$, or $CHF_3$; a mixed gas, in which $O_2$ gas, $H_2$ gas, or an inert gas such as He, Ar, or the like is added as appropriate to the fluorine-based gas; or the like can be used. Preferably, a mixed gas containing $CF_4$ and $O_2$, a mixed gas containing $SF_6$ and $O_2$, a mixed gas containing $CHF_3$ and He, or a mixed gas containing $CF_4$ and $H_2$ is used. Further, the etching is not limited to dry etching; wet etching may be used. In that case, the island-shaped semiconductor layer 32 can be formed by wet etching the semiconductor layer 201 using an organic alkaline solution typified by TMAH (tetramethylammonium hydroxide). Note that when TMAH or the like is used as an etchant, because etching is selective such that only the semiconductor layer 201 is etched, etching can be performed without damaging the base insulating layer 31. When a semiconductor layer formed over an insulating surface is separated into island shapes in this manner, elements can be separated from each other in the case where a plurality of thin film transistors and peripheral circuits are formed over the same substrate. That is, even in the case where a memory element array which requires a voltage of approximately 10 to 20 V to perform writing and erasing and a peripheral circuit which operates at a voltage of approximately 3 to 7 V and mainly performs data input/output and command control are formed over the same substrate, mutual interference caused by the difference in voltages applied to each element can be prevented.

Further, a cross-section of an end portion of the island-shaped semiconductor layer 32 is not necessarily a tapered shape. Taking reduction of poor coverage by the film formed in the vicinity of the end portion of the semiconductor layer 32 into consideration, the smaller a step angle θ of the end portion of the island-shaped semiconductor layer 32 is, the more preferable; however, etching may be performed such that the step angle θ is from approximately 45° to 95°, so the cross-section of the end portion has a tapered shape or a perpendicular shape.

Next, the insulating layer 36 is formed at the end portion (a side surface) of the semiconductor layer 32 (FIGS. 2B and 2F). In this embodiment mode, as in Embodiment Mode 1, the insulating layer 36 is an oxide film formed by performing wet oxidation on the end portion of the semiconductor layer 32.

Subsequently, the gate insulating layer 33 is formed so as to cover the semiconductor layer 32. The gate insulating layer 33 can be formed using silicon oxide, silicon nitride, silicon oxynitride ($SiO_xN_y$, where x>y>0), silicon nitride oxide ($SiN_xO_y$, where x>y>0), or the like. Such an insulating layer can be formed by a chemical vapor deposition method or a sputtering method. Further, a silicon oxide film, a silicon nitride film, a silicon oxynitride ($SiO_xN_y$, where x>y>0) film, a silicon nitride oxide ($SiN_xO_y$, where x>y>0) film, or the like which is formed on the surface of the semiconductor layer 32 by performing a plasma treatment on the surface of the semiconductor layer 32 in an atmosphere which contains oxygen or an atmosphere which contains nitrogen, or the like can be used as the gate insulating layer 33.

Figure 2C:
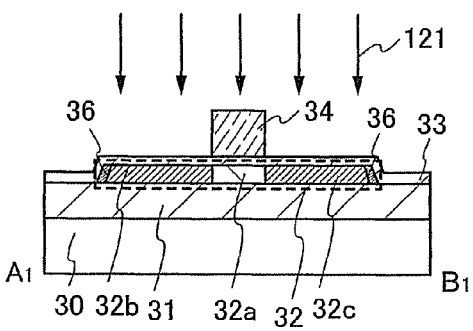
Figure 2G:
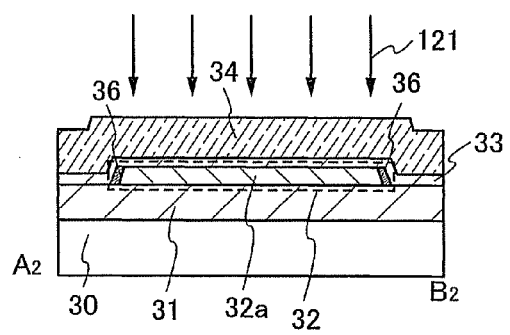

Next, the conductive layer 34 which serves as a gate electrode is formed over the gate insulating layer 33 (FIGS. 2C and 2G). In this embodiment mode, an example where the conductive layer 34 is formed as a single layer is shown; however, the conductive layer 34 may of course alternatively have a structure in which conductive material is provided in a stack of layers containing two, three or more layers. Note that the conductive layer 34 can be formed by selectively etching a conductive layer which is formed so as to cover the gate insulating layer 33, although this is not shown in the drawings.

The conductive layer 34 can be formed using an element such as tantalum (Ta), tungsten (W), titanium (Ti), molybdenum (Mo), aluminum (Al), copper (Cu), chromium (Cr), niobium (Nb), or the like, or using an alloy material or a compound material containing any of such elements as a main component. Alternatively, the conductive layer 34 can be formed using a semiconductor material typified by polycrystalline silicon doped with an impurity element such as phosphorus. For example, in a case where the conductive layer 34 has a stacked structure including a first conductive layer and a second conductive layer, tantalum nitride may be used as the first conductive layer and tungsten may be used as the second conductive layer. Note that the conductive layer 34 is not limited to this combination. When the conductive layer 34 is formed with a stacked structure, the conductive layer 34 can be provided by freely combining any of the materials described above.

Subsequently, by using the conductive layer 34 as a mask and introducing an impurity element 121 into the semiconductor layer 32, the impurity regions 32b and 32c and the channel forming region 32a into which the impurity element 121 is not introduced are formed in the semiconductor layer 32 (FIGS. 2C and 2G). Note that in this embodiment mode, because the impurity element is introduced after the conductive layer 34 is formed so as to go across the island-shaped semiconductor layer 32, the impurity regions 32b and 32c are formed in regions of the semiconductor layer 32 which are not covered by the conductive layer 34, and the channel forming region 32a into which the impurity element 121 is not introduced is formed in a region of the semiconductor layer 32 which is covered by the conductive layer 34.

In this embodiment mode, an impurity element with n-type conductivity or p-type conductivity can be used as the impurity element 121. As an impurity element with n-type conductivity, phosphorus (P), arsenic (As), or the like can be used. As an impurity element with p-type conductivity, boron (B), aluminum (Al), gallium (Ga), or the like can be used. For example, phosphorus (P) can be used as the impurity element 121 and introduced into the semiconductor layer 32 such that it is contained in the semiconductor layer 32 at a concentration of from $1\times10^{18}$ to $1\times10^{21}/cm^3$ to form the impurity regions 32b and 32c which have n-type conductivity. Further, low-concentration impurity regions (LDD regions), to which an impurity is added at a lower concentration than that of the impurity regions 32b and 32c, may be formed between the channel forming region 32a and the impurity regions 32b and 32c. By providing a low-concentration impurity region, an electric field at an end portion of a drain on an LDD region side can be reduced, and degradation caused by repetition of writing and erasing can be suppressed.

Further, an impurity element which has the opposite conductivity type to the impurity added to the impurity regions 32b and 32c (e.g., boron, with respect to an n-type TFT) may be added to the channel forming region 32a. When an impurity with an opposite conductivity type is added into the channel forming region 32a, the threshold voltage of a TFT can be controlled. Note that this impurity element may be added by doping via the gate electrode, or may be added in advance before the gate electrode is formed.

Figure 2D:
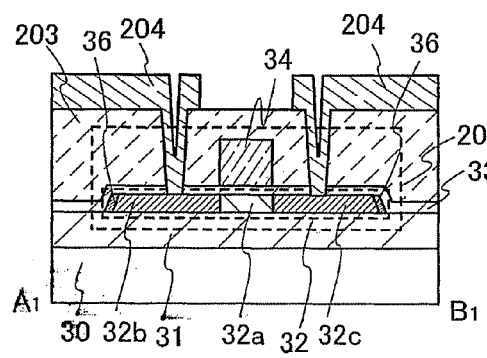
Figure 2H:
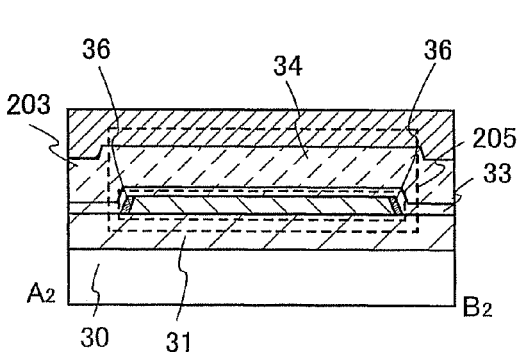

Then, the insulating layer 203 is formed so as to cover the conductive layer 34, the gate insulating layer 33, the insulating layer 31, and the like (FIGS. 2D and 2H). Subsequently, contact holes are formed in the gate insulating layer 33 and the insulating layer 203, and the conductive layers 204 which each serve as a source electrode or a drain electrode are selectively formed over the insulating layer 203 (FIGS. 2D and 2H). In this embodiment mode, the conductive layer 204 is provided so as to be electrically connected to the impurity regions 32b and 32c which each serve as a source region or a drain region of the semiconductor layer 32.

As the insulating layer 203, silicon oxide, silicon oxynitride ($SiO_xN_y$, where x>y>0), silicon nitride oxide ($SiN_xO_y$, where x>y>0), or the like, which is formed by a CVD method, a sputtering method, or the like, can be used. Alternatively, the insulating layer 203 can be a single layer or a stack of layers, which includes an organic material such as polyimide, polyamide, polyvinyl phenol, benzocyclobutene, acrylic, epoxy, or the like; a siloxane material, such as a siloxane resin; an oxazole resin; or the like. Note that a siloxane material corresponds to a material including a Si—O—Si bond. Siloxane is a material having a backbone structure formed of bonds between silicon (Si) and oxygen (O). As a substituent, an organic group containing at least hydrogen (e.g., an alkyl group or an aryl group) can be used. Alternatively, a fluoro group can be used as the substituent. An oxazole resin is, for example, photosensitive polybenzoxazole, or the like. Photosensitive polybenzoxazole is a material which has a low dielectric constant (a dielectric constant of 2.9 at 1 MHz at room temperature), high heat resistance (according to results of thermogravimetry—differential thermal analysis (TG-DTA), it has a thermal decomposition temperature of 550° C. at a rate of temperature increase of 5° C./min), and a low water absorption percentage (0.3% at room temperature over 24 hours). Compared to a relative dielectric constant of polyimide or the like (approximately 3.2 to 3.4), an oxazole resin has a lower dielectric constant (approximately 2.9). Therefore, when an oxazole resin is used, generation of parasitic capacitance can be suppressed, and high-speed operation is possible. In this embodiment mode, a single layer or stacked layers including silicon oxide, silicon oxynitride ($SiO_xN_y$, where x>y>0), or silicon nitride oxide ($SiN_xO_y$, where x>y>0), which is formed by a CVD method is provided as the insulating layer 203. Alternatively, the insulating layer 203 may be formed as a stacked layer including an organic material such as polyimide, polyamide, polyvinyl phenol, benzocyclobutene, acrylic, or epoxy; a siloxane material such as a siloxane resin or the like; or an oxazole resin.

As the conductive layer 204, a single layer structure or a stacked layer structure formed from one of the elements aluminum, tungsten, titanium, tantalum, molybdenum, nickel, and neodymium, or from an alloy containing a plurality of those elements, can be used. For example, as the conductive layer 204 formed from an alloy containing a plurality of the elements, an aluminum alloy containing titanium, an aluminum alloy containing neodymium, or the like can be used. Further, in a case where the conductive layer 204 is provided as a stacked layer structure, a structure in which an aluminum layer or an aluminum alloy layer such those described above is interposed between titanium layers may be employed, for example.

Through the above-described process, a semiconductor device including the thin film transistor 205 can be manufactured.

By employing the semiconductor device manufacturing process described in this embodiment mode, a semiconductor device having the insulating layer 36 at an end portion (a side surface) of the channel forming region 32a of the semiconductor layer 32 below a gate electrode can be manufactured. Accordingly, the adverse effect on the semiconductor device caused by poor coverage of a surface of the semiconductor layer 32 by the gate insulating layer 33 can be reduced. That is, in a semiconductor device manufactured using the method of this embodiment mode, the side surface of the channel forming region of the semiconductor layer 32 is not in contact with the gate electrode, and therefore, gate leakage faults can be reduced and the withstand voltage of the gate electrode can be improved.

Further, since the insulating layer can be selectively thickly provided at the end portion of the channel forming region 32a of the semiconductor layer 32, electric field concentration at the end portion of the channel forming region 32a of the semiconductor layer 32 can be reduced. Accordingly, gate leakage faults can be reduced and the withstand voltage of the gate electrode can be improved.

In this embodiment mode, when performing a plasma treatment on the semiconductor layer 32 surface in an atmosphere containing oxygen or an atmosphere containing nitrogen to form the gate insulating layer 33, preferably a plasma in which the electron density is or greater than or equal to $1 \times 10^{11}$ cm$^{-3}$ and the electron temperature is less than or equal to 1.5 eV is used. More specifically, preferably a plasma in which the electron density is greater than or equal to $1 \times 10^{11}$ cm$^{-3}$ and less than or equal to $1 \times 10^{13}$ cm$^{-3}$, and the electron temperature is greater than or equal to 0.5 eV and less than or equal to 1.5 eV is used. In the plasma, the electron density of the plasma is high and the electron temperature in the vicinity of an object to be treated (here, the semiconductor layer 32) which is formed over the substrate 30 is low; therefore, the object to be treated can be prevented from being damaged by the plasma. Further, because the plasma has a high electron density of greater than or equal to $1 \times 10^{11}$ cm$^{-3}$, an oxide film or nitride film formed by using the plasma treatment can have superior uniformity of film thickness and the like and can be denser, compared with a film formed by a CVD method, a sputtering method, or the like. Further, since the plasma has a low electron temperature of less than or equal to 1.5 eV, oxidation or nitridation can be performed at a lower temperature than conventional plasma treatment or thermal oxidation methods. For example, oxidation can be performed sufficiently even when the plasma treatment is performed at a temperature which is lower than the strain point of a glass substrate by 100° C. or more. Further, as a frequency for producing plasma, a high frequency wave such as a microwave (e.g., a microwave with a frequency of 2.45 GHz) can be used.

Further, as an atmosphere containing oxygen which is used in the plasma treatment, for example, a mixed gas atmosphere containing oxygen ($O_2$) and a rare gas (including at least one of He, Ne, Ar, Kr, and Xe); a mixed gas atmosphere containing oxygen, hydrogen ($H_2$), and a rare gas; a mixed gas atmosphere containing dinitrogen oxide and a rare gas; or a mixed gas atmosphere containing dinitrogen oxide, hydrogen, and a rare gas can be used to perform the plasma treatment. For example, a mixed gas containing oxygen ($O_2$), hydrogen ($H_2$), and argon (Ar) can be used. In that case, a mixed gas containing oxygen with a flow rate of 0.1 to 100 sccm, hydrogen with a flow rate of 0.1 to 100 sccm, and argon (Ar) with a flow rate of 100 to 5000 sccm can be used. Note that preferably the mixed gas is introduced with an oxygen:hydrogen:argon ratio of 1:1:100. For example, it may be introduced with oxygen with a flow rate of 5 sccm, hydrogen with a flow rate of 5 sccm, and argon with a flow rate of 500 sccm.

Further, as an atmosphere containing nitrogen which is used in a plasma treatment, for example, a mixed gas atmosphere containing nitrogen ($N_2$) and a rare gas (including at least one of He, Ne, Ar, Kr, and Xe); a mixed gas atmosphere containing nitrogen, hydrogen, and a rare gas; or a mixed gas atmosphere containing ammonia ($NH_3$) and a rare gas can be used to perform the plasma treatment.

A structural example of a device for performing the plasma treatment will now be described with reference to FIG. 17.

Figure 17:
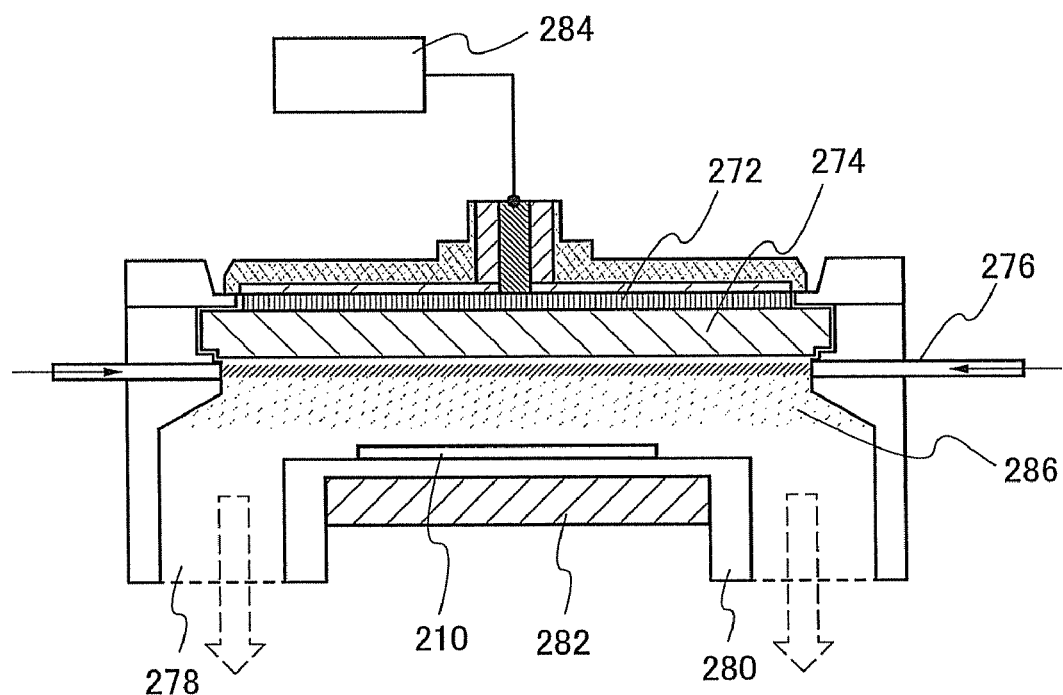
FIG. 17 is a cross section which shows a structure of a plasma treatment apparatus.

A plasma treatment apparatus shown in FIG. 17 includes a support 280 for placing a substrate 210 on; a gas supply portion 276 for introducing gas; an exhaust port 278 which is connected to a vacuum pump for exhausting gas; an antenna 272; a dielectric plate 274; and a microwave supply portion 284 which supplies microwaves for producing plasma. Further, providing the support 280 with a temperature control portion 282 enables the temperature of the substrate 210 to be controlled.

An example of a plasma treatment method will now be described.

Oxidation or nitridation may be performed as follows. First, a treatment chamber is vacuated, and a gas for plasma treatment which contains oxygen or nitrogen is introduced from the gas supply portion 276. The substrate 210 is at room temperature or is heated to 100 to 550° C. by the temperature control portion 282. Note that the distance between the substrate 210 and the dielectric plate 274 is approximately 20 to 80 mm (preferably, 20 to 60 mm). Next, a microwave is supplied from the microwave supply portion 284 to the antenna 272. Then, when the microwave is introduced to the inside of the treatment chamber from the antenna 272 via the dielectric plate 274, a plasma 286 is generated. When the plasma is excited by the introduction of microwaves, a plasma with a low electron temperature (less than or equal to 3 eV; preferably, less than or equal to 1.5 eV) and a high electron density (greater than or equal to $1 \times 10^{11}$ cm$^{-3}$) can be generated. A surface of a semiconductor substrate can be oxidized or nitridized by oxygen radicals (which may include OH radicals) and/or nitrogen radicals (which may include NH radicals) that are generated in this high-density plasma. When a rare gas such as argon is mixed in with the gas for the plasma treatment, oxygen radicals or nitrogen radicals can be effectively generated by an excited species of the rare gas. In this plasma treatment method, by effectively using active radicals which have been excited by the plasma, oxidation which employs a solid phase reaction or nitridation which employs a solid phase reaction can be performed at a low temperature of less than or equal to 500° C.

When solid phase oxidation or solid phase nitridation performed using a plasma treatment such as that described above is employed, even when a glass substrate with an allowable temperature limit of less than or equal to 700° C. is used, an insulating layer which is equivalent to a thermally-oxidized film formed at a temperature of 950 to 1050° C. can be obtained. That is, an insulating layer which is highly reliable as an insulating layer of a semiconductor element, particularly a thin film transistor or a nonvolatile memory element, can be formed.

For example, in the case of using the plasma treatment apparatus shown in FIG. 17 to form the gate insulating layer 33, it is preferable to, for example, use a plasma treatment in an oxygen atmosphere to oxidize a surface of the semiconductor layer 32 which is formed of silicon to form a silicon oxide layer with a thickness of 3 to 6 nm, and subsequently to process a surface of the silicon oxide layer using plasma treatment in a nitrogen atmosphere to form a nitrogen plasma-treated layer. Specifically, first, a silicon oxide layer with a thickness of 3 to 6 nm is formed over the semiconductor layer 32 by a plasma treatment in an oxygen atmosphere. Then, by following that with a plasma treatment in a nitrogen atmosphere, a nitrogen plasma-treated layer with a high nitrogen concentration is provided on a surface of the silicon oxide layer or near the surface of the silicon oxide layer. Note that 'near the surface' means at a depth of approximately 0.5 to 1.5 nm from the surface of the silicon oxide layer. For example, by performing a plasma treatment in a nitrogen atmosphere, a structure in which a nitrogen plasma-treated layer which contains 20 to 50 atomic % nitrogen is formed at a depth of approximately 1 nm from the surface of the silicon oxide layer results. By nitriding the silicon oxide layer surface, the layer can be made denser and an insulating layer with a high withstand voltage can be formed.

Further, the plasma treatment apparatus described in this embodiment mode can perform oxidation, nitridation, oxynitriding, hydrogenation, surface modification, or the like of a semiconductor substrate, an insulating layer, or a conductive layer. When such a treatment is performed, the gas which is supplied from the gas supply portion 276 may be selected as appropriate to suit the purpose of the treatment.

Embodiment Mode 3

In this embodiment mode, a method of manufacturing the semiconductor device shown in FIGS. 1A to 1C which differs to that described in Embodiment Mode 2 will be described. In this embodiment mode, manufacturing process steps which relate to the cross section taken along the broken line joining A1 and B1 in FIG. 1A are explained with reference to FIGS. 3A and 3B, and manufacturing process steps which relate to the cross section along the broken line joining A2 and B2 in FIG. 1A are explained with reference to FIGS. 3C and 3D.

Figure 3A:
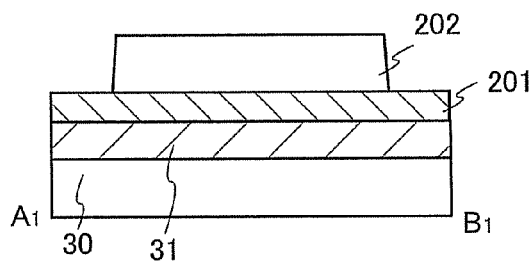
FIGS. 3A to 3D are cross sections showing manufacturing process steps of a thin film transistor of the invention.
Figure 3C:
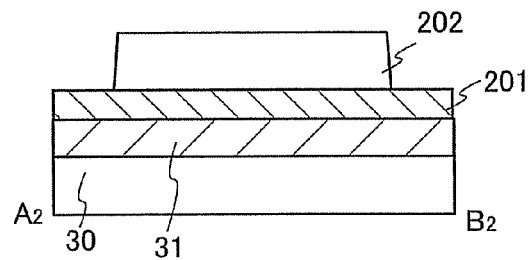

First, as in Embodiment Mode 2, the insulating layer 31 is formed over the substrate 30, the semiconductor layer 201 is formed over the insulating layer 31, and the resist 202 is formed over the semiconductor layer 201 (FIGS. 3A and 3C).

Figure 3B:
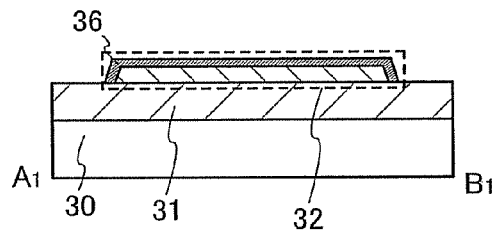
Figure 3D:
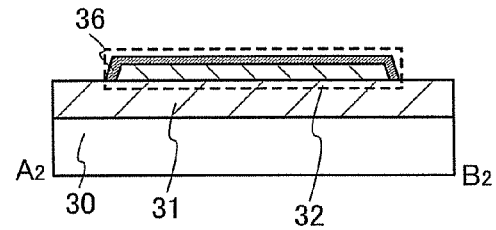

Next, the island-shaped semiconductor layer 32 is formed by etching the semiconductor layer 201 using the resist 202 as a mask (FIGS. 3B and 3D).

Subsequently, by removing the resist 202, then oxidizing the surface of the semiconductor layer 32 using wet oxidation, the insulating layer 36 is formed over an end portion (a side surface) of the semiconductor layer 32 and over the surface of the semiconductor layer 32.

By performing subsequent process steps similarly to the manner in which those in Embodiment Mode 2 are performed, the semiconductor device shown in FIGS. 1A to 1C can be manufactured.

Figure 4A:
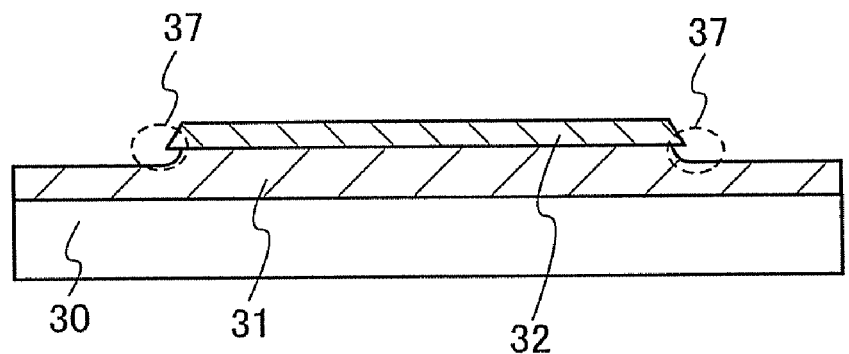
FIGS. 4A and 4B are cross sections showing manufacturing process steps of a thin film transistor of the invention.

Note that if necessary, before using wet oxidation to oxidize the surface of the semiconductor layer 32 to form the insulating layer 36, the surface of the semiconductor layer 32 may be cleaned using dilute hydrofluoric acid or the like. It is preferable to clean the surface of the semiconductor layer 32 because the semiconductor layer 32 may come into contact with atmospheric oxygen and be oxidized, resulting in a native oxide film being formed over the surface; or particles may become attached to the surface; and so on. However, when the semiconductor layer 32 is cleaned, the insulating layer 31 which is formed as a base film of the semiconductor layer 32 may be partially removed and a recess 37 may be formed, as shown in FIG. 4A. In the case where a recess 37 is formed, when the gate insulating layer is formed over the semiconductor layer 32, the gate insulating layer may not be able to completely cover a step formed by the semiconductor layer 32 and the recess 37, so a partial break in the gate insulating layer may result. Therefore, there is a possibility that the semiconductor layer 32 may come into contact with the conductive layer which serves as a gate electrode, and leakage current may occur between the semiconductor layer 32 and the conductive layer which serves as the gate electrode.

Figure 4B:
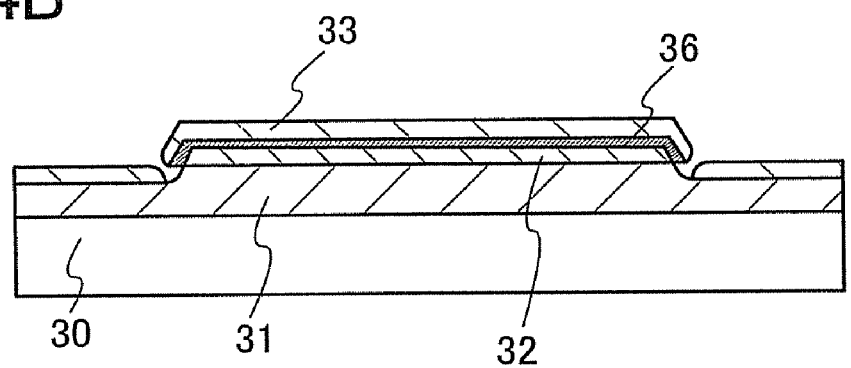

However, when the semiconductor layer surface is oxidized using wet oxidation and the insulating layer 36 is formed over the end portion of the semiconductor layer 32 and the surface of the semiconductor layer 32, as described in this embodiment mode, even if coverage by the gate insulating layer 33 is faulty due to the recess 37 section, as shown in FIG. 4B, the channel forming region of the semiconductor layer 32 does not come in contact with the conductive layer which serves as the gate electrode.

Figure 5A:
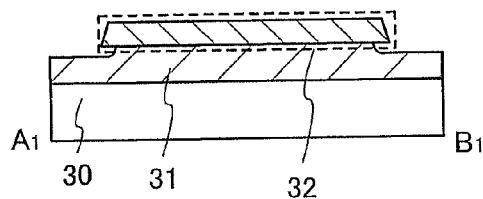
FIGS. 5A to 5H are cross sections showing manufacturing process steps of a thin film transistor of the invention.
Figure 5E:
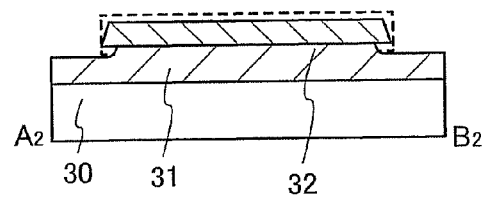

Further, wet oxidation may be performed after treating the semiconductor layer 32 surface with dilute hydrofluoric acid and then forming the gate insulating layer 33. FIGS. 5A to 5H show cross-sectional structures of an element in which the semiconductor layer 32 surface has been treated with dilute hydrofluoric acid. FIGS. 5A and 5E show that the insulating layer 31 has been partially removed by the dilute hydrofluoric acid treatment.

Figure 5B:
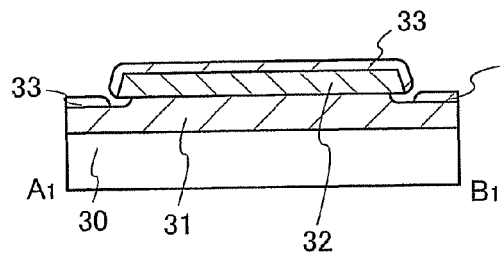
Figure 5F:
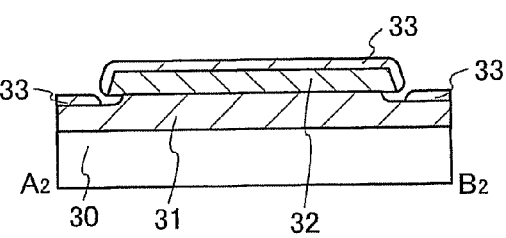

Next, the gate insulating layer 33 is formed over the semiconductor layer 32 (FIGS. 5B and 5F). Note that the gate insulating layer 33 can be formed in the same manner as the gate insulating layer 33 in a previous embodiment mode. In this embodiment mode, since the insulating layer 31 is partially removed, there is a possibility that the gate insulating layer 33 is not formed on an underside of the semiconductor layer 32.

Figure 5C:
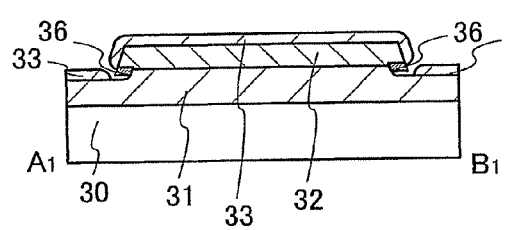
Figure 5G:
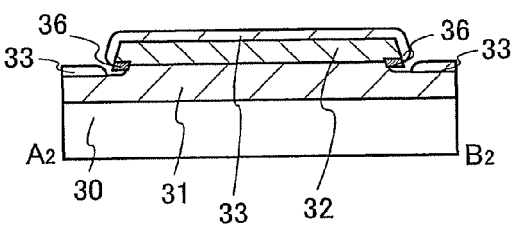

Subsequently, the surface of the gate insulating layer 33 is oxidized using wet oxidation. In this embodiment mode, a section of the semiconductor layer 32 surface which is not covered by the gate insulating layer 33 is oxidized by the wet oxidation, and thus the insulating layer 36 can be formed over a part of the semiconductor layer 32 surface which is not covered by the gate insulating layer 33 (FIGS. 5C and 5G).

Figure 5D:
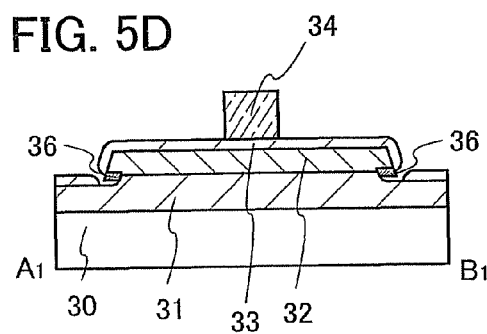
Figure 5H:
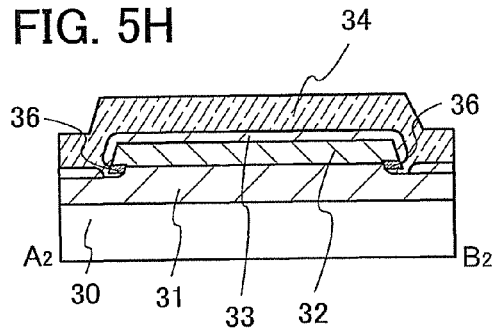

Next, the conductive layer 34 which serves as the gate electrode is formed over the gate insulating layer 33 (FIGS. 5D and 5H). Note that the conductive layer 34 can be formed in a similar manner to the conductive layer 34 described in a previous embodiment mode.

By treating the semiconductor layer 32 surface with dilute hydrofluoric acid, then forming the gate insulating layer 33 and performing wet oxidation, the insulating layer 36 can be formed over a part of the semiconductor layer 32 surface which is not covered by the gate insulating layer 33. Accordingly, the surface of the semiconductor layer 32 can be formed such that it does not come in contact with the conductive layer 34 which serves as the gate electrode.

By using the semiconductor device manufacturing process steps described in this embodiment mode, a semiconductor device having the insulating layer 36 at an end portion (a side surface) of the channel forming region 32a of the semiconductor layer 32 which is under the gate electrode can be manufactured. Accordingly, the adverse effect on the semiconductor device caused by poor coverage of a surface of the semiconductor layer 32 by the gate insulating layer 33 can be reduced. That is, in a semiconductor device manufactured using the method of this embodiment mode, the side surface of the channel faulting region 32a is not in contact with the gate electrode, and therefore, gate leakage faults can be reduced and the withstand voltage of the gate electrode can be improved.

Further, since the insulating layer can be selectively thickly provided at the end portion of the channel forming region 32a of the semiconductor layer 32, electric field concentration at the end portion of the channel forming region 32a of the semiconductor layer 32 can be reduced. Accordingly, gate leakage faults can be reduced and the withstand voltage of the gate electrode can be improved.

Embodiment Mode 4

In this embodiment mode, a method of manufacturing the semiconductor device shown in FIGS. 1A to 1C which differs to those described in Embodiment Modes 2 and 3 will be described. In this embodiment mode, manufacturing process steps which relate to the cross section taken along the broken line joining A1 and B1 in FIG. 1A are described with reference to FIGS. 6A to 6D, and manufacturing process steps which relate to the cross section taken along the broken line joining A2 and B2 in FIG. 1A are described with reference to FIGS. 6E to 6H.

Figure 6A:
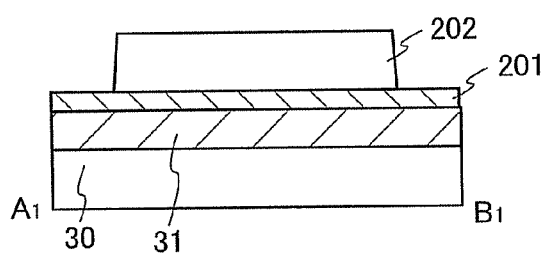
FIGS. 6A to 6H are cross sections showing manufacturing process steps of a thin film transistor of the invention.
Figure 6E:
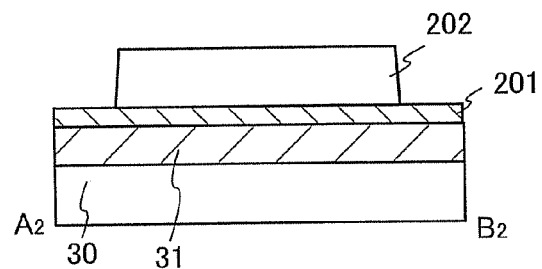

First, as in Embodiment Mode 2, the insulating layer 31 is formed over the substrate 30, the semiconductor layer 201 is formed over the insulating layer 31, and the resist 202 is formed over the semiconductor layer 201 (FIGS. 6A and 6E).

Figure 6B:
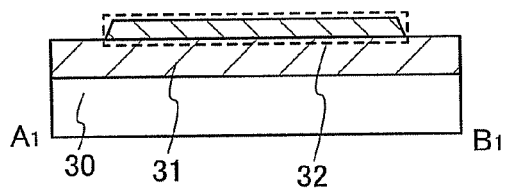
Figure 6F:
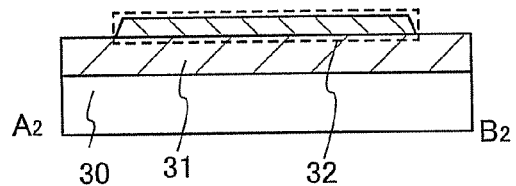

Next, the island-shaped semiconductor layer 32 is formed by etching the semiconductor layer 201 using the resist 202 as a mask (FIGS. 6B and 6F). Then, the resist 202 is removed, and the semiconductor layer 32 surface is cleaned using dilute hydrofluoric acid (FIGS. 6B and 6F). In this embodiment mode, a native oxide film which has formed over the semiconductor layer 32 surface can be removed by treating the semiconductor layer 32 surface with dilute hydrofluoric acid before forming the first insulating layer 33 over the semiconductor layer 32.

Figure 6C:
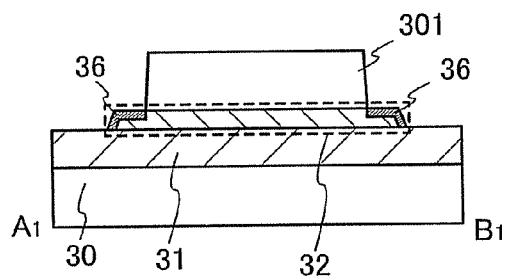
Figure 6G:
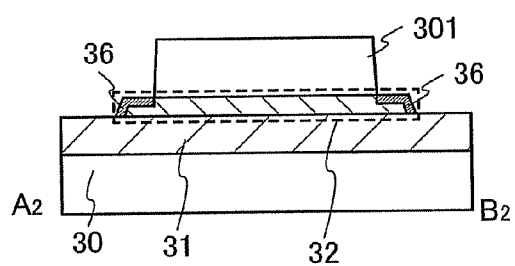

Then, a resist 301 is formed over the semiconductor layer 32 (FIGS. 6C and 6G). In this embodiment mode, the resist 301 is formed in a region which is inside that of the semiconductor layer 32. That is, the resist 301 partially covers the surface of the semiconductor layer 32.

Figure 7A:
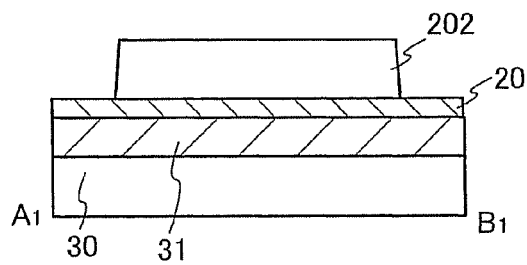
FIGS. 7A to 7F are cross sections showing manufacturing process steps of a thin film transistor of the invention.
Figure 7D:
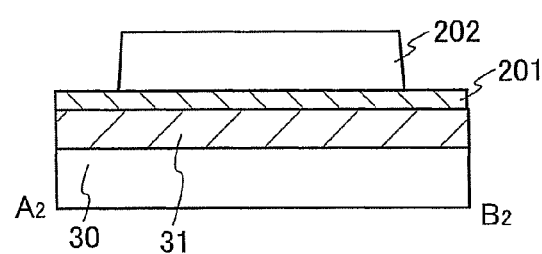
Figure 7B:
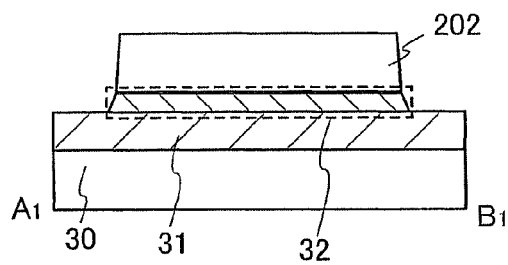
Figure 7E:
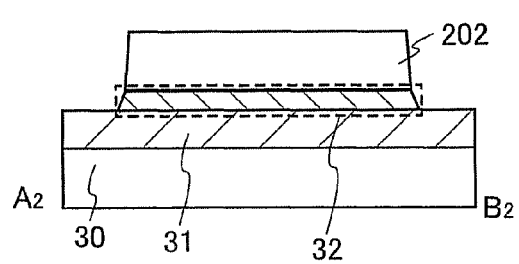
Figure 7C:
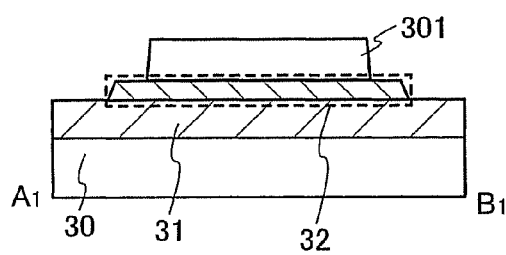
Figure 7F:
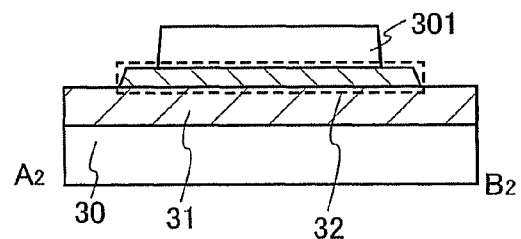

Note that the resist 301 which partially covers the surface of the semiconductor layer 32 may be formed by partially etching the resist 202 to cause a side surface of the resist 202 to recede. That is, first, the insulating layer 31 is formed over the substrate 30, as in FIGS. 6A and 6E; then the semiconductor layer 201 is formed over the insulating layer 31; and the resist 202 is formed over the semiconductor layer 201 (FIGS. 7A and 7D). Then, by etching the semiconductor layer 201 using the resist 202 as a mask, the island-shaped semiconductor layer 32 is formed (FIGS. 7B and 7E). Next, the resist 202 is etched, causing a side surface of the resist 202 to recede. Thus, the width of the resist 202 decreases, and the resist 301 which partially covers the surface of the semiconductor layer 32 is formed.

Then, by using the resist 301 as a mask and oxidizing the semiconductor layer 32 surface using wet oxidation, the insulating layer 36 is formed over an end portion (a side surface) of the semiconductor layer 32 and over part of a top surface of the semiconductor layer 32 (FIGS. 6C and 6G).

Figure 6D:
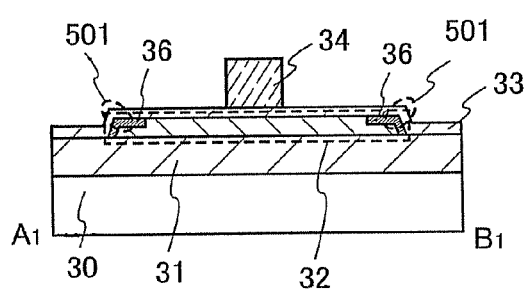
Figure 6H:
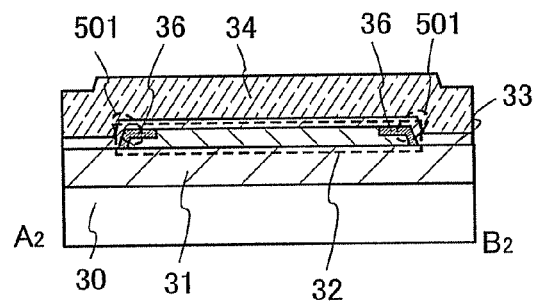

Next, the resist 301 is removed and the gate insulating layer 33 is formed over the semiconductor layer 32. Further, the conductive layer 34 which serves as a gate electrode is formed over the gate insulating layer 33 (FIGS. 6D and 6H). Note that the gate insulating layer 33 and the conductive layer 34 can be formed in a similar manner to the gate insulating layer 33 and the conductive layer 34 described in a previous embodiment mode.

Subsequently, by performing process steps similar to those in Embodiment Mode 2, a semiconductor device such as that shown in FIGS. 1A to 1C can be manufactured.

Because the insulating layer 36 is formed over the end portion of the semiconductor layer 32 and over part of the top surface of the semiconductor layer 32, in an angled portion of the semiconductor layer 32 (in the vicinity of a region 501 in FIGS. 6D and 6H) where an electric field tends to be concentrated, the thickness of a part of the insulating layer formed under the conductive layer 34 can be increased. Accordingly, electric field concentration can be prevented more effectively.

By employing the semiconductor device manufacturing process steps described in this embodiment mode, a semiconductor device having the insulating layer 36 at an end portion (a side surface) of the channel forming region 32a of the semiconductor layer which is under a gate electrode can be manufactured. Accordingly, the adverse effect on the semiconductor device caused by poor coverage of a surface of the semiconductor layer 32 by the gate insulating layer 33 can be reduced. That is, in a semiconductor device manufactured using the method of this embodiment mode, the side surface of the channel forming region 32a is not in contact with the gate electrode, and therefore, gate leakage faults can be reduced and the withstand voltage of the gate electrode can be improved.

Embodiment Mode 5

In this embodiment mode, a semiconductor device in which an oxide film formed from silicon oxide is formed in a single crystal silicon substrate, and a single crystal semiconductor thin film formed over the oxide film is used as a channel forming region will be described. In this embodiment mode, a semiconductor device which employs an SOI technology referred to as SIMOX will be described.

First, a single crystal silicon substrate 601 which serves as a material for forming a single crystal silicon layer is prepared (FIG. 8A). In this embodiment mode, a case where a p-type single crystal silicon substrate is used is described; however, an n-type single crystal silicon substrate may be used. Of course, a single crystal silicon germanium substrate can also be used.

Next, oxygen ions are added to the single crystal silicon substrate 601, and an oxygen containing layer 602 is formed at a predetermined depth (FIG. 8B). The oxygen ions may be added using a dose amount of, for example, approximately $1 \times 10^{18}$ atoms/cm$^2$. Note that the depth at which the oxygen containing layer 602 is formed (the distance between a main surface of the single crystal silicon substrate 601 and the oxygen containing layer 602) is the thickness of a single crystal silicon layer which serves as an active layer of a TFT which is formed subsequently.

Next, a heat treatment is performed at a temperature of 800 to 1200° C. and the oxygen containing layer 602 is changed into an embedded insulating layer 603. The width of the oxygen containing layer 602 in a depth direction is determined by the distribution of the oxygen ions when the ions are added. Because the concentration of the oxygen ions decreases in a direction going from 611 to 612, an interface between the single crystal silicon substrate 601 and the oxygen containing layer 602 is unclear; however, through this heat treatment step, the interface between the single crystal silicon substrate 601 and the buried insulating layer 603 becomes clear (FIGS. 8B and 8C).

The thickness of the buried insulating layer 603 is 10 to 500 nm (typically, 20 to 50 nm). In this embodiment mode, because the interface between the single crystal silicon substrate 601 and the buried insulating layer 603 bonds stably, a thin buried insulating layer 603 with a thickness of approximately 20 to 50 nm can be formed.

When the buried insulating layer 603 is formed in this manner, a part of the single crystal silicon substrate is left over the buried insulating layer 603, and thus single crystal silicon layer 604 is formed. Note that the depth at which the oxygen containing layer 602 is formed is adjusted so that the thickness of the single crystal silicon layer 604 is 10 to 200 nm (preferably, 10 to 50 nm, more preferably, 10 to 30 nm).

Next, a resist is selectively formed over the single crystal silicon layer 604 and the single crystal silicon layer 604 is selectively etched, to form an island-shaped single crystal silicon layer 605 which serves as an active layer of a TFT (FIG. 8D). Note that in this embodiment mode, only one island-shaped single crystal silicon layer is described; however, a plurality of island-shaped single crystal silicon layers may be formed over one substrate.

Figure 9A:
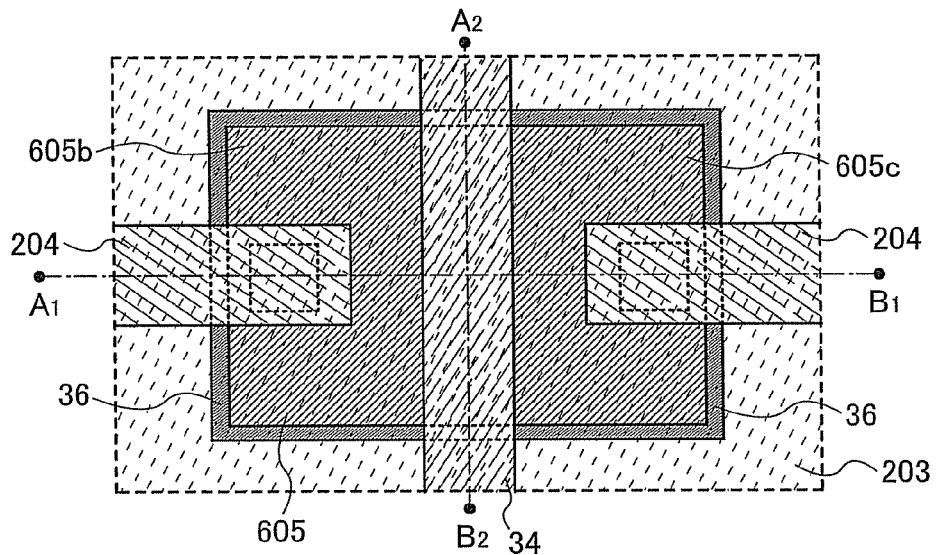
FIGS. 9A to 9C are a top view and cross sections of a structure of a thin film transistor of the invention.
Figure 9B:
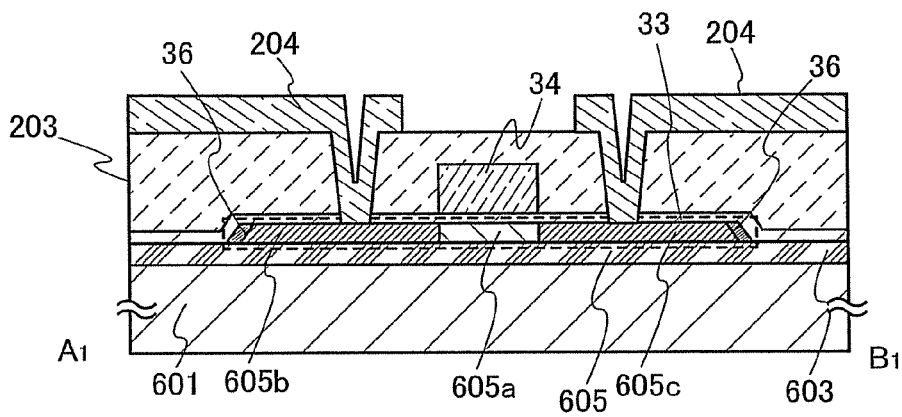
Figure 9C:
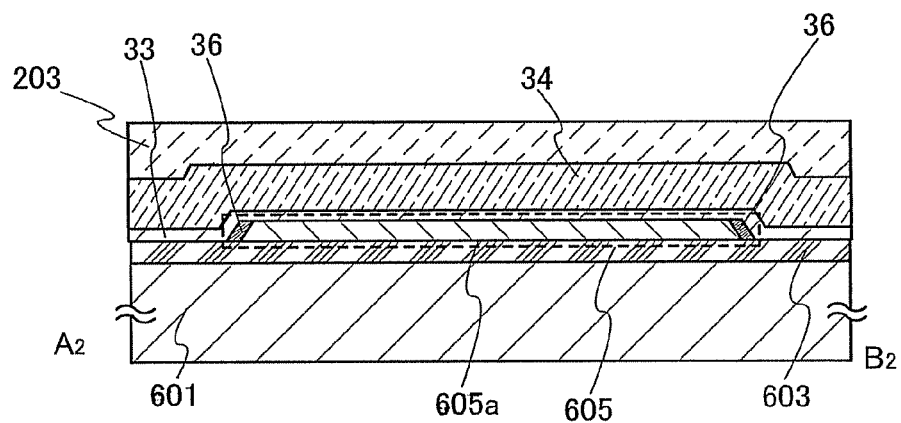

Subsequently, by performing process steps similar to those in Embodiment Mode 2 or 3, a semiconductor device such as that shown in FIGS. 9A to 9C can be manufactured. Note that in this embodiment mode, a thin film transistor is shown as an example of a semiconductor device. FIG. 9A is a top view which shows main parts of a thin film transistor. FIG. 9B shows a cross section taken along the broken line joining A1 and B1 in FIG. 9A. FIG. 9C shows a cross section taken along the broken line joining A2 and B2 in FIG. 9A.

The thin film transistor shown in FIGS. 9A to 9C includes the island-shaped single crystal silicon layer 605 which is provided over the single crystal silicon substrate 601 with the embedded insulating layer 603 interposed therebetween; the gate insulating layer 33 which is formed over the island-shaped single crystal silicon layer 605; the conductive layer 34 which serves as a gate electrode, which is provided over the island-shaped single crystal silicon layer 605 with the gate insulating layer 33 interposed therebetween; the insulating layer 203, which covers the gate insulating layer 33 and the conductive layer 34; and the conductive layer 204, which serves as a source electrode or a drain electrode over the insulating layer 203. The island-shaped single crystal silicon layer 605 includes a channel forming region 605a and impurity regions 605b and 605c which each serve as a source region or a drain region. The insulating layer 36 is formed over an end portion of the island-shaped single crystal silicon layer 605, which in this embodiment mode is a section which is in contact with the channel forming region 605a which is below the conductive layer 34. Note that the insulating layer 36 can be formed by performing a plasma treatment on a surface of the island-shaped single crystal silicon layer 605 in an atmosphere containing oxygen. Further, an impurity with a conductivity type opposite to that of an impurity added to the impurity regions 605b and 605c may be added to the channel forming region 605a.

According to this embodiment mode, a semiconductor device having the insulating layer 36 at an end portion (a side surface) of the channel forming region 605a of the single crystal silicon layer 605 which is under the gate electrode can be manufactured. Accordingly, the adverse effect on the semiconductor device caused by poor coverage of the single crystal silicon layer 605 surface by the gate insulating layer 33 can be reduced. That is, in a semiconductor device manufactured using the method of this embodiment mode, the side surface of the channel forming region 605a is not in contact with the gate electrode, and therefore, electric field concentration does not occur, gate leakage faults can be reduced, and the withstand voltage of the gate electrode can be improved.

Further, since the insulating layer can be selectively thickly provided at the end portion of the channel forming region 605a of the single crystal silicon layer 605, electric field concentration at the end portion of the channel forming region 605a of the single crystal silicon layer 605 can be reduced. Accordingly, gate leakage faults can be reduced and the withstand voltage of the gate electrode can be improved.

Embodiment Mode 6

In this embodiment mode, a semiconductor device in which an oxide film formed from silicon oxide is formed over a single crystal silicon substrate, and a single crystal semiconductor thin film formed over the oxide film is used as a channel forming region will be described. In this embodiment mode, a semiconductor device that employs an SOI substrate which is formed using a Smart-Cut method will be described.

First, a single crystal silicon substrate 801 which serves as a material for forming a single crystal silicon layer is prepared. In this embodiment mode, a case where a p-type single crystal silicon substrate is used is described; however, an n-type single crystal silicon substrate may be used. Of course, a single crystal silicon germanium substrate can also be used.

Figure 10A:
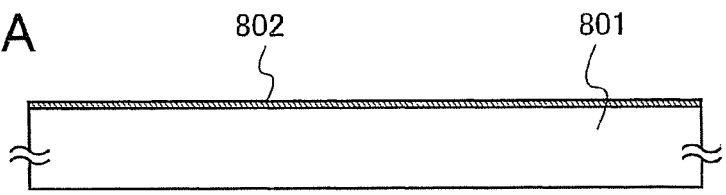
FIGS. 10A to 10F are cross sections showing a manufacturing process steps of a thin film transistor of the invention.

Next, thermal oxidation is performed to form a silicon oxide film 802 over a main surface of the substrate 801 (a surface which corresponds to an element formation surface). The film thickness may be decided as appropriate by a practitioner of the invention; however, preferably it is 10 to 500 nm (typically, 20 to 50 nm). The silicon oxide film 802 later serves as part of a buried insulating layer of an SOI substrate (FIG. 10A).

Figure 10B:
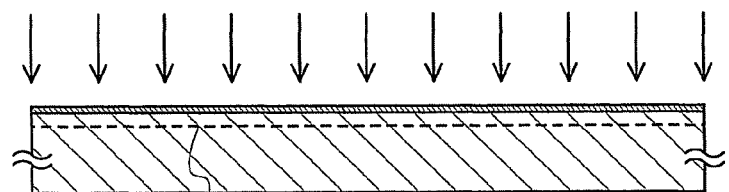

Next, hydrogen ions are added from the main surface side of the single crystal silicon substrate 801 on via the silicon oxide film 802 to faun a hydrogen containing layer 803 (FIG. 10B). Note that the depth at which the hydrogen containing layer 803 is formed (the distance between the main surface of the single crystal silicon substrate 801 and the hydrogen containing layer 803) is the thickness of a single crystal silicon layer which serves as an active layer of a TFT. For example, hydrogen ions can be added by an ion implantation method using a dose amount of $1 \times 10^{16}$ to $1 \times 10^{17}$ atoms/cm$^2$ such that a single crystal silicon layer with a thickness of 50 nm remains between the main surface of the single crystal silicon substrate 801 and the hydrogen containing layer 803.

Figure 10C:
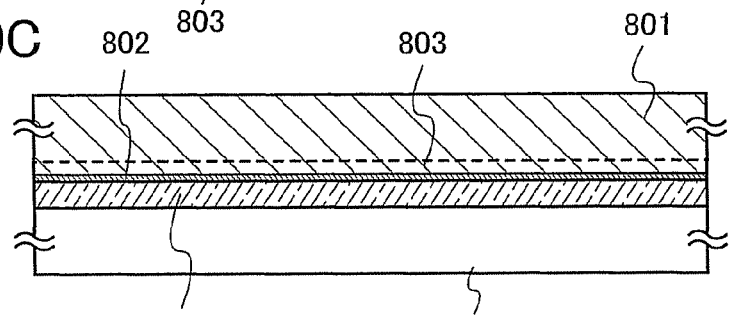

Next, the single crystal silicon substrate 801 and a supporting substrate are bonded. In this embodiment mode, a single crystal silicon substrate 804 is used as the supporting substrate, and a silicon oxide film 805 for bonding is provided over a surface of the single crystal silicon substrate 804 (FIG. 10C). Note that instead of the single crystal silicon substrate 804, a silicon substrate formed by a float zone method, a polycrystalline silicon substrate, or the like may be used. Further, a substrate with high thermostability, such as a quartz substrate, a ceramic substrate, a crystallized glass substrate, or the like may also be used.

When bonding is performed, the bonding interface is two highly hydrophilic silicon oxide films. Therefore, the substrates are bonded by hydrogen bonding which occurs due to the reaction of moisture contained in both the surfaces.

Figure 10D:
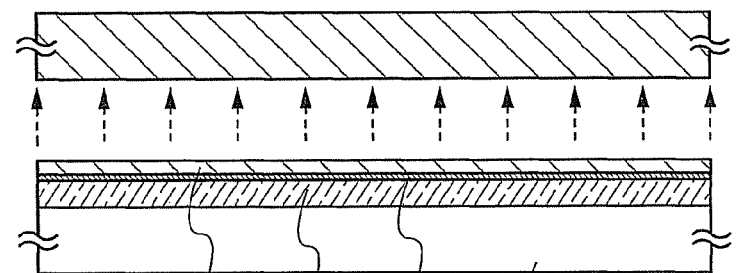

Next, a heat treatment (a first heat treatment) is performed at a temperature of 400 to 600° C. (e.g., at 500° C.). Through this heat treatment, a volumetric change caused by microscopic depletion occurs in the hydrogen containing layer 803, and a ruptured section forms along the hydrogen containing layer 803. Therefore, the single crystal silicon substrate 801 is separated, and the silicon oxide film 802 and a single crystal silicon layer 806 are left over the supporting substrate (FIG. 10D).

Figure 10E:
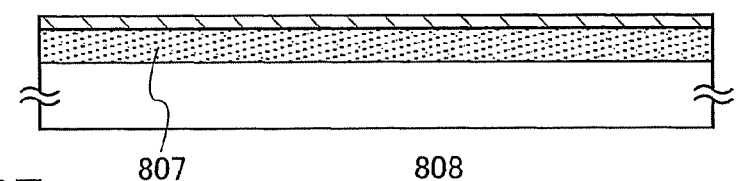

Next, as a second heat treatment step, an annealing furnace step is performed at a temperature in the range of 1050 to 1150° C. (e.g., 1100° C.). In this step, stress of Si—O—Si bonds is relieved at the bonding interface, so the bonding interface stabilizes. That is, this is a step for completely bonding the single crystal silicon layer 806 to the supporting substrate. When the bonding interface stabilizes in this manner, a buried insulating layer 807 is formed (FIG. 10E). Note that in this embodiment mode, the hydrogen containing layer 803 is formed and the thin film single crystal silicon layer 806 is formed by creating a ruptured section along the hydrogen containing layer 803; however, the method for forming the single crystal silicon layer 806 is not limited to this. The thin film single crystal silicon layer 806 may be formed without providing the hydrogen containing layer 803, by polishing the single crystal silicon substrate 801.

Next, treatment for planarizing a surface of the single crystal silicon layer 806 may be performed. For the planarization, a polishing step referred to as chemical mechanical polishing (CMP) or a furnace annealing treatment performed in a reducing atmosphere at a high temperature (approximately 900 to 1200° C.) may be performed.

The final thickness of the single crystal silicon layer 806 is 10 to 200 nm (preferably, 10 to 50 nm, more preferably, 10 to 30 nm).

Figure 10F:
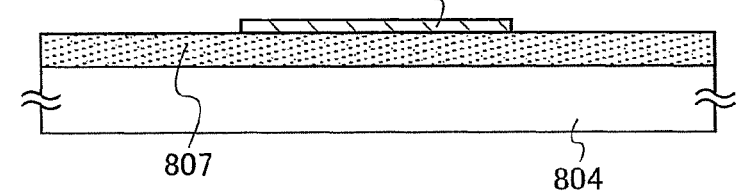

Next, a resist is selectively fainted over the single crystal silicon layer 806 and the single crystal silicon layer 806 is selectively etched, to form an island-shaped single crystal silicon layer 808 which serves as an active layer of a TFT (FIG. 10F). Note that in this embodiment mode, only one island-shaped single crystal silicon layer is described; however, a plurality of island-shaped single crystal silicon layers may be formed over one substrate.

Subsequently, by performing similar process steps to those described in Embodiment Mode 2 or 3, as a semiconductor device, a thin film transistor in which an island-shaped single crystal silicon layer is used as an active layer can be formed.

The thin film transistor manufactured in this embodiment mode includes, for example, the island-shaped single crystal silicon layer 808 which is provided over the single crystal silicon substrate 804 with the buried insulating layer 807 interposed therebetween, a gate insulating layer which is formed over the island-shaped single crystal silicon layer 808, and a conductive layer which serves as a gate electrode which is provided over the island-shaped single crystal silicon layer 808 with the gate insulating layer interposed therebetween. Note that the island-shaped single crystal silicon layer 808 includes a channel forming region and impurity regions which each serve as a source region or a drain region. Further, at an end portion of the island-shaped single crystal silicon layer 808, which in this embodiment mode is a section which is in contact with the channel forming region which is below the conductive layer which serves as a gate electrode, an insulating layer is formed. Note that the insulating layer which is formed so as to be in contact with the channel forming region can be formed by performing a plasma treatment on a surface of the island-shaped single crystal silicon layer 808 in an atmosphere containing oxygen.

According to this embodiment mode, a semiconductor device having an insulating layer at an end portion (a side surface) of a channel forming region of a single crystal silicon layer under a gate electrode can be manufactured. Accordingly, the adverse effect on the semiconductor device caused by poor coverage of the single crystal silicon layer surface by the gate insulating layer can be reduced. That is, in a semiconductor device manufactured using the method of this embodiment mode, the side surface of the channel forming region is not in contact with the gate electrode. Therefore, electric field concentration does not occur, gate leakage faults can be reduced, and the withstand voltage of the gate electrode can be improved.

Further, since the insulating layer can be selectively thickly provided at the end portion of the channel forming region of the single crystal silicon layer, electric field concentration at the end portion of the channel forming region of the single crystal silicon layer can be reduced. Accordingly, gate leakage faults can be reduced and the withstand voltage of the gate electrode can be improved.

Embodiment Mode 7

A semiconductor device of the invention is not limited to being a thin film transistor, and can take all sorts of forms. In this embodiment mode, a nonvolatile memory element is used as an example of a semiconductor device to which the invention is applied, and a structure of the nonvolatile memory element will be described.

Figure 12A:
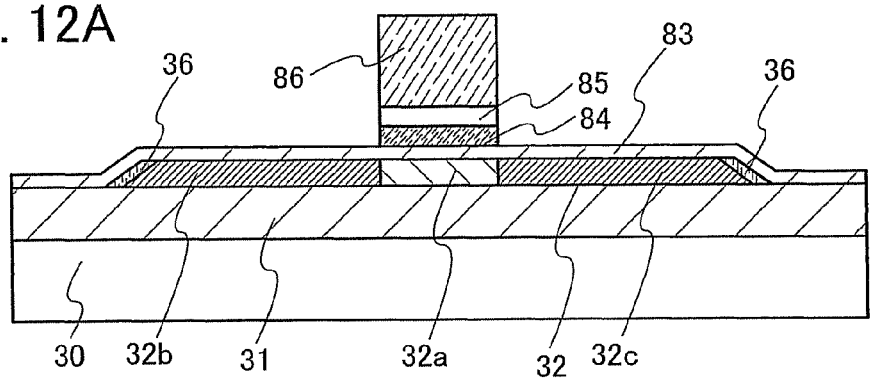
FIGS. 12A to 12D are cross sections showing a structure of a nonvolatile memory element of the invention.

In a nonvolatile memory element shown in FIG. 12A, an insulating layer 83 which serves as a tunnel oxide film is formed over the semiconductor layer 32; and a charge storage layer 84, an insulating layer 85 which serves as a control insulating film, and a conductive layer 86 which serves as a gate electrode are formed over the insulating layer 83. Further, end portions of the charge storage layer 84 and the conductive layer 86 which serves as a gate electrode are aligned with each other. Note that the nonvolatile memory element of this embodiment mode includes the insulating layer 36 which is formed at an end portion of the semiconductor layer 32 using a method described in a previous embodiment mode. Further, the nonvolatile memory element shown in FIG. 12A has a single-drain structure in which the semiconductor layer 32 includes the channel forming region 32a and the high-concentration impurity regions 32b and 32c but does not include low-concentration impurity regions. A processing step for forming low-concentration impurity regions is not necessary for such a nonvolatile memory element, so throughput can be improved.

The insulating layer 83 which serves as a tunnel oxide film is used as a tunnel insulating layer for injecting charge to the charge storage layer 84. The insulating layer 83 can be formed using a method and materials similar to those used for the gate insulating layer 33 described in Embodiment Mode 1. Representatively, the insulating layer 83 can be formed using silicon oxide, a stacked layer structure which includes silicon oxide and silicon nitride, or the like. Further, the insulating layer 83 may be formed by oxidizing the surface of the semiconductor layer 32 by a high-density plasma treatment using the apparatus shown in FIG. 17. Further, the insulating layer 83 may be formed by forming an insulating layer by a plasma CVD method using silicon oxide, then performing a plasma treatment using the apparatus shown in FIG. 17 to oxidize or nitride the insulating layer. In that case, in the case where a surface of the silicon oxide is nitrided, a nitrogen plasma-treated layer with a high nitrogen concentration is provided over the surface or near the surface of the silicon oxide layer. Note that 'near the surface' means at a depth of approximately 0.5 to 1.5 nm from the surface of the silicon oxide layer. For example, by performing a plasma treatment in a nitrogen atmosphere, a nitrogen plasma-treated layer which contains 20 to 50 atomic % nitrogen is formed at a depth of approximately 1 nm from the surface of the silicon oxide layer.

In a case which will be described below where the charge storage layer 84 is a floating gate which is farmed using a conductive layer or a semiconductor layer, preferably the insulating layer 83 is formed with a thickness of 3 to 6 nm. For example, in a case where a gate length is 600 nm, the insulating layer 83 can be formed with a thickness of 3 to 6 nm. Further, in a case which will be described below where the charge storage layer 84 is formed using an insulating layer, the insulating layer 83 is preferably formed with a thickness of 1 to 10 nm; more preferably, 1 to 5 nm. For example, in a case where the gate length is 600 nm, the insulating layer 83 can be formed with a thickness of 1 to 3 nm.

The charge storage layer 84 can be a floating gate formed of a layer or particles of a semiconductor material or a conductive material. As a semiconductor material, silicon, silicon germanium, or the like may be used. In the case of using silicon, amorphous silicon or polysilicon can be used. Further, polysilicon doped with phosphorus can be used. As a conductive material for the charge storage layer 84, any of the elements tantalum (Ta), titanium (Ti), molybdenum (Mo), and tungsten (W); an alloy including one of those elements as a main component; an alloy film in which any of those elements are combined (representatively, a Mo—W alloy film or a Mo—Ta alloy film); or a silicon film provided with conductivity may be used. Under a conductive layer formed of such a material, a nitride such as tantalum nitride, tungsten nitride, titanium nitride, or molybdenum nitride; or a silicide such as tungsten silicide, titanium silicide, or molybdenum silicide may be formed. Further, a stacked layer structure which includes above-described semiconductor materials, conductive materials, or above-described semiconductor and conductive materials may be employed. For example, a stacked layer structure which includes a silicon layer and a germanium layer may be used.

Alternatively, the charge storage layer 84 may be formed of an insulating material which has traps which hold charge. Typical examples of such a material are a silicon compound or a germanium compound. As a silicon compound, silicon nitride, silicon oxynitride, silicon oxynitride to which hydrogen has been added, or the like may be used. As a germanium compound, germanium nitride, germanium nitride to which oxygen has been added, germanium oxide to which nitrogen has been added, germanium nitride to which oxygen and hydrogen have been added, germanium oxide to which nitrogen and hydrogen have been added, or the like may be used.

The insulating layer 85 which serves as a control insulating film is formed of a single layer or a plurality of layers containing silicon oxide, silicon nitride, silicon oxynitride, aluminum oxide, or the like, formed by a low pressure CVD method, a plasma CVD method, or the like. The insulating layer 85 is formed with a thickness of 1 to 20 nm; preferably, 5 to 10 nm. For example, a stack formed by depositing a silicon nitride layer with a thickness of 3 nm and a silicon oxide layer with a thickness of 5 nm can be used.

For the conductive layer 86 which serves as a gate electrode, the materials and manufacturing method used for the conductive layer 34 which serves as a gate electrode which was described in Embodiment Mode 2 can be used as appropriate.

Figure 12B:
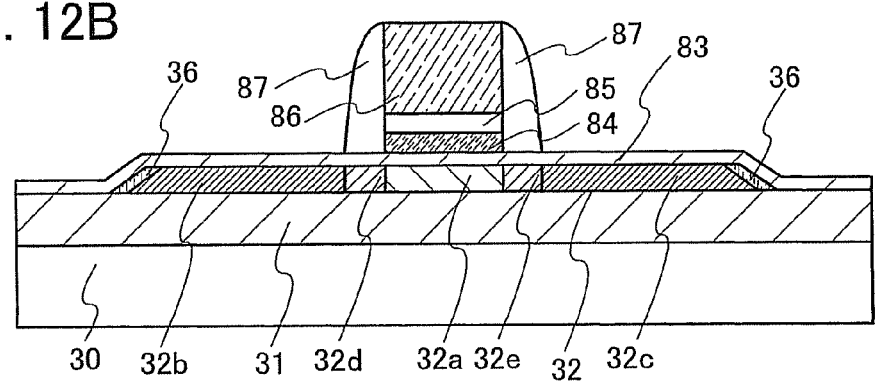

Furthermore, as shown in FIG. 12B, masks 87 may be formed on side surfaces of the charge storage layer 84, the insulating layer 85 which serves as a control insulating film, and the conductive layer 86 which serves as a gate electrode. Further, the masks 87 overlap the low-concentration impurity regions 32d and 32e with the insulating layer 83 interposed therebetween. When the masks 87 are formed, an impurity can be added to the semiconductor layer, through the masks 87. That is, through a step of adding an impurity, the channel forming region 32a, the high-concentration impurity regions 32b and 32c, and the low-concentration impurity regions 32d and 32e can be formed in the semiconductor layer 32 at the same time. Therefore, throughput can be improved.

Figure 12C:
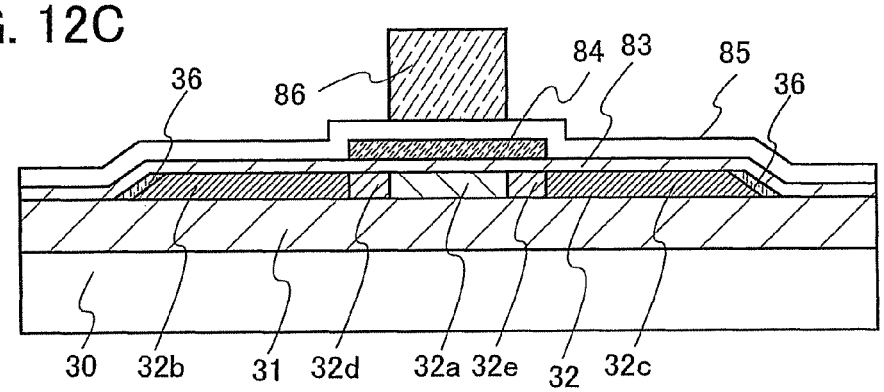

Alternatively, as shown in FIG. 12C, a structure in which the charge storage layer 84 is larger than the conductive layer 86 which serves as a gate electrode may be employed. That is, the charge storage layer 84 may extend outward. Regions of the charge storage layer 84 which are formed outside of the conductive layer 86 overlap the low-concentration impurity regions 32d and 32e with the insulating layer 83 interposed therebetween. When the charge storage layer 84 and the conductive layer 86 which serves as a gate electrode are formed in this way, an impurity can be added to the semiconductor layer through the regions of the charge storage layer 84 which are formed outside of the conductive layer 86. That is, through a step of adding an impurity, the channel forming region 32a, the high-concentration impurity regions 32b and 32c, and the low-concentration impurity regions 32d and 32e can be formed in the semiconductor layer 32 at the same time. Therefore, throughput can be improved.

Figure 12D:
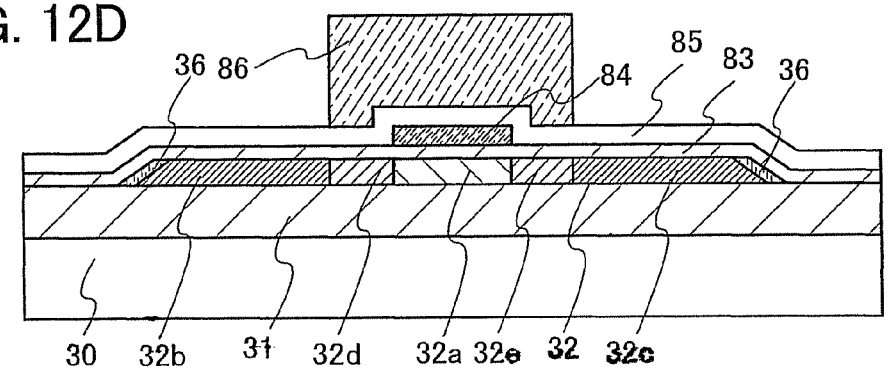

Further alternatively, as shown in FIG. 12D, a structure in which the charge storage layer 84 is smaller than the conductive layer 86 which serves as a gate electrode may be used. In a nonvolatile memory element with such a structure, before the conductive layer 86 which serves as a gate electrode is formed, an impurity is added to the semiconductor layer 32 at a low concentration to form the low-concentration impurity regions 32d and 32e. Then, the conductive layer 86 which serves as a gate electrode is formed. Subsequently, the high-concentration impurity regions 32b and 32c can be formed by adding an impurity to the semiconductor layer 32 at a high concentration using the conductive layer 86 as a mask.

In this embodiment mode, a nonvolatile memory element having the insulating layer 36 at an end portion (a side surface) of part of the semiconductor layer 32 which is under the gate electrode can be manufactured. Accordingly, the adverse effect on the semiconductor device caused by poor coverage of the semiconductor layer 32 surface by the gate insulating layer 83 can be reduced. That is, in a semiconductor device manufactured using the method of this embodiment mode, because the side surface of the semiconductor layer 32 is not in contact with the gate electrode, gate leakage faults can be reduced and the withstand voltage of the gate can be improved.

Further, because the insulating layer can be selectively thickly provided at the end portion of the semiconductor layer 32, electric field concentration at the end portion of the semiconductor layer 32 can be reduced. Accordingly, gate leakage faults can be reduced and the withstand voltage of the gate electrode can be improved.

Embodiment Mode 8

Figure 18:
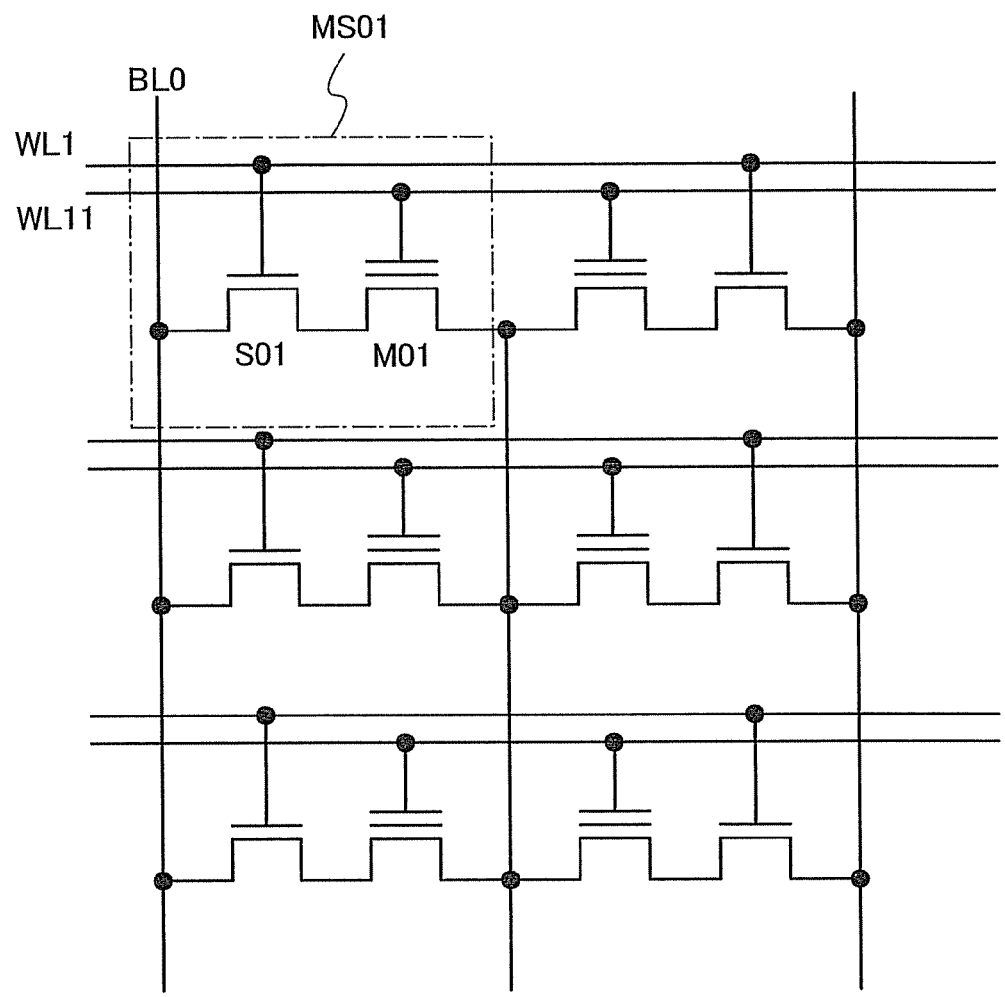
FIG. 18 shows an example of an equivalent circuit of a nonvolatile memory cell array.

In this embodiment mode, a structure of a memory cell array which employs the nonvolatile memory element described in the previous embodiment mode will be described. FIG. 18 shows an example of an equivalent circuit of a NOR-type memory cell array. A memory cell MS01 which stores one bit of information includes a select transistor S01 and a nonvolatile memory element M01. The select transistor S01 is inserted in series between a bit line BL0 and the nonvolatile memory element M01, and a gate of the select transistor S01 is connected to a word line WL1. Further, a gate of the nonvolatile memory element M01 is connected to a word line WL11. When data is written to the nonvolatile memory element M01, potentials of the word line WL1 and the bit line BL0 are set at H level and a potential of a bit line BL1 is set at L level, and a high voltage is applied to the word line WL11, so that charge is stored in a charge storage layer. When data is to be erased, the potentials of the word line WL1 and the bit line BL0 may be set at H level and a high negative voltage may be applied to the word line WL11.

In the memory cell MS01, the select transistor S01 and the nonvolatile memory element M01 are formed using a semiconductor layer separated into an island shape over an insulating surface, so interference with other select transistors or nonvolatile memory elements can be prevented even when an element separation region is not provided. Further, because the select transistor S01 and the nonvolatile memory element M01 in the memory cell MS01 are both n-channel, when they are both formed using a single island-shaped semiconductor layer, a wiring for connecting the two elements can be omitted.

Figure 19:
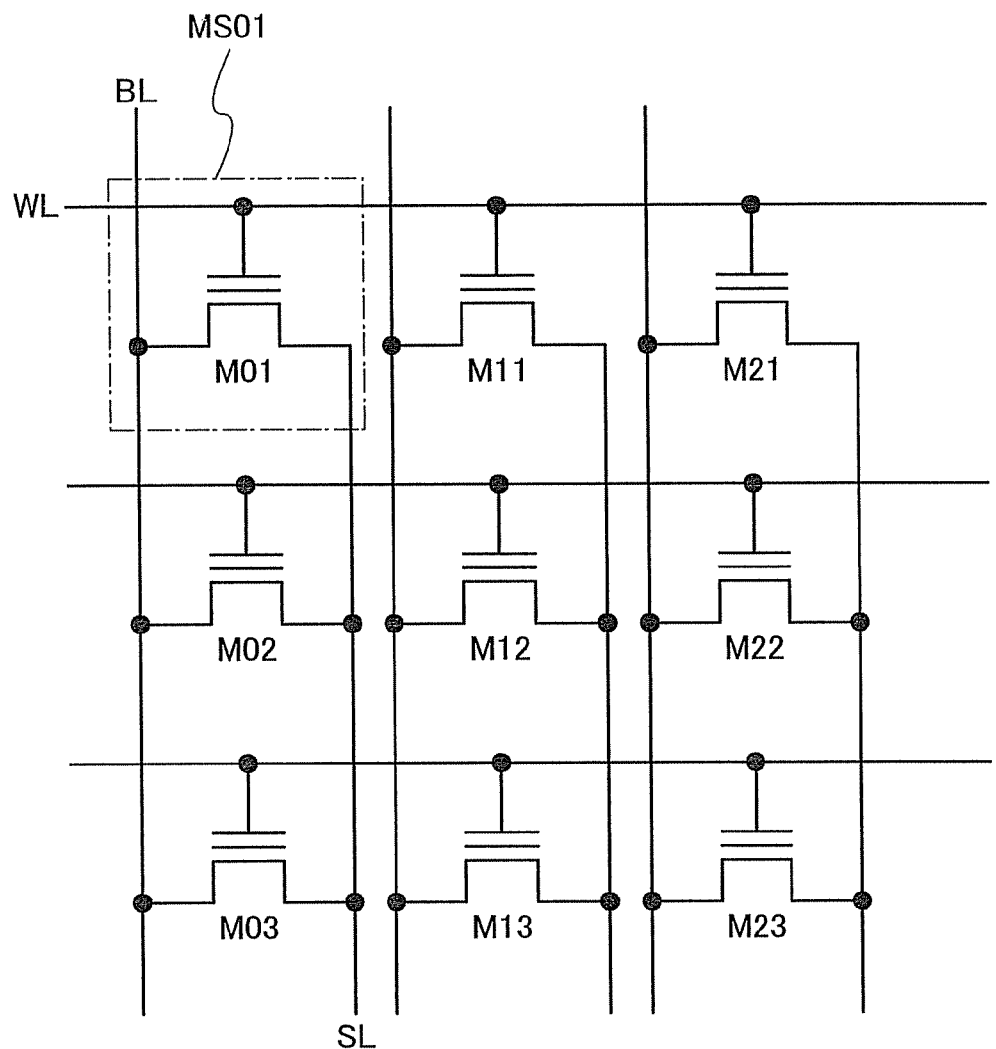
FIG. 19 shows an example of an equivalent circuit of a NOR-type nonvolatile memory cell array.

FIG. 19 shows a NOR-type equivalent circuit in which a nonvolatile memory element is directly connected to a bit line. In this memory cell array, word lines WL and bit lines BL are disposed such that they cross each other, and a nonvolatile memory element is disposed at each intersection. In the case of a NOR-type circuit, the drain of each nonvolatile memory element is connected to a bit line BL. Sources of the nonvolatile memory elements are connected in common to source lines SL.

In this case also, in the memory cell MS01, the nonvolatile memory element M01 is formed using a semiconductor layer separated into an island shape over an insulating surface, so that interference with other nonvolatile memory elements can be prevented even if an element separation region is not provided. Further, when a plurality of nonvolatile memory elements (for example, elements M01 to M23 in FIG. 19) are treated as a single block, and these nonvolatile memory elements are formed using a single semiconductor layer separated into island shapes, erasing operations can be performed in block units.

Operations of a NOR-type are, for example, as follows. For data writing, a source line SL is set to 0 V, a high voltage is applied to a word line WL selected for writing of data, and a potential corresponding to data "0" or data "1" is applied to a bit line BL. For example, potentials of H level and L level for data "0" and data "1", respectively, are applied to the bit line BL. In a nonvolatile memory element supplied with H-level potential for writing data "0", hot electrons are generated near the drain, and are injected into the floating gate. Such electron injection does not occur in the case of data "1".

In a memory cell to which data "0" is supplied, hot electrons are generated near the drain by a strong transverse electric field between the source and the drain, and are injected into the charge storage layer. The consequent state in which the threshold voltage has been increased by the electrons injected into the charge storage layer corresponds to "0". In the case of data "1", hot electrons are not generated, and a state in which electrons are not injected into the charge storage layer and the threshold voltage is low, that is, an erasing state, is maintained.

When data is to be erased, a positive voltage of approximately 10 V is applied to the source line SL, and the bit line BL is put in a floating state. Then, a high negative voltage is applied to the word line (a high negative voltage is applied to a control gate), so that electrons are drawn out from the charge storage layer. An erasing state, data "1", results.

In a data reading operation, the source line SL is set to 0 V; the bit line BL is set to approximately 0.8 V; a reading voltage, which is set at the mean value of the threshold voltage when data is "0" and the threshold voltage when data of "1", is applied to a selected word line WL; and a sense amplifier connected to the bit line BL determines whether or not current of the nonvolatile memory element has been drawn.

Figure 20:
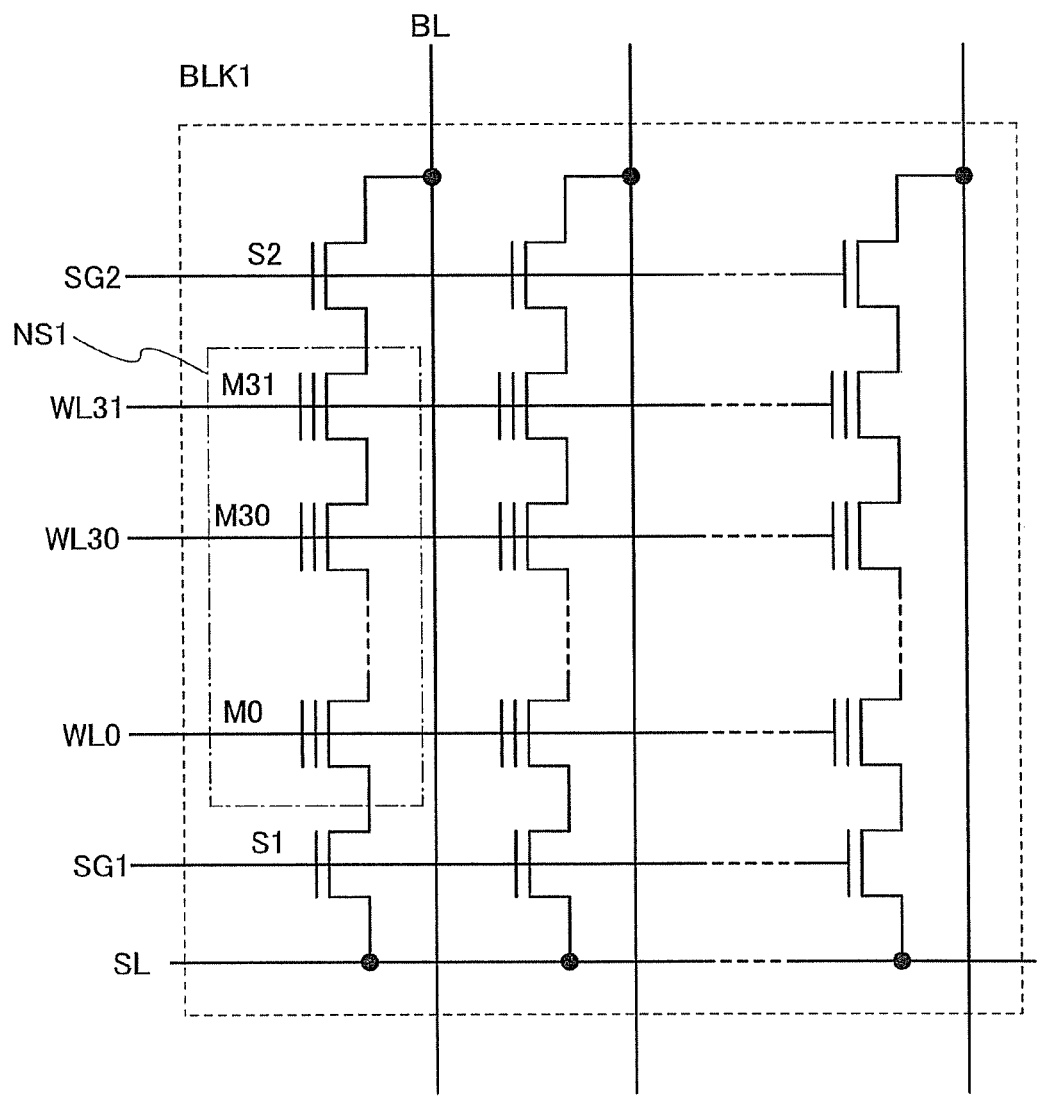
FIG. 20 shows an example of an equivalent circuit of a NAND-type nonvolatile memory cell array.

FIG. 20 shows an equivalent circuit of a NAND-type memory cell array. A NAND cell NS1, in which a plurality of nonvolatile memory elements is connected in series, is connected to a bit line BL. A block BLK1 includes a plurality of NAND cells which are grouped together. A block BLK1 shown in FIG. 20 has 32 word lines (word lines WL0 to WL31). Nonvolatile memory elements disposed in the same row in the block BLK1 are connected in common to a word line which corresponds to that row.

In this case, because select transistors S1 and S2 and nonvolatile memory elements M0 to M31 are connected in series, they may be formed as a single group using a single semiconductor layer. Accordingly, a wiring for connecting the nonvolatile memory elements can be omitted, and thus, integration can be achieved. Further, adjacent NAND cells can easily be separated. Alternatively, a semiconductor layer over which the select transistors S1 and S2 are formed may be separate to a semiconductor layer over which the NAND cell NS1 is formed. Accordingly, an erasing operation during which electrons are extracted from the charge accumulation layer of each of the nonvolatile memory cells M0 to M31 may be performed in NAND cell units. Alternatively, nonvolatile memory elements connected to a common word line (for example, those in the row of the nonvolatile memory element M30) may be formed from a single semiconductor layer.

A writing operation is carried out after the NAND cell NS1 is put into an erasure state, that is, a state in which the threshold value of each nonvolatile memory element of the NAND cell NS1 is a negative voltage. Writing is performed in order from the memory element M0 on the source line SL side. The writing operation will be roughly described below, using writing to the memory element M0 as an example.

Figure 21A:
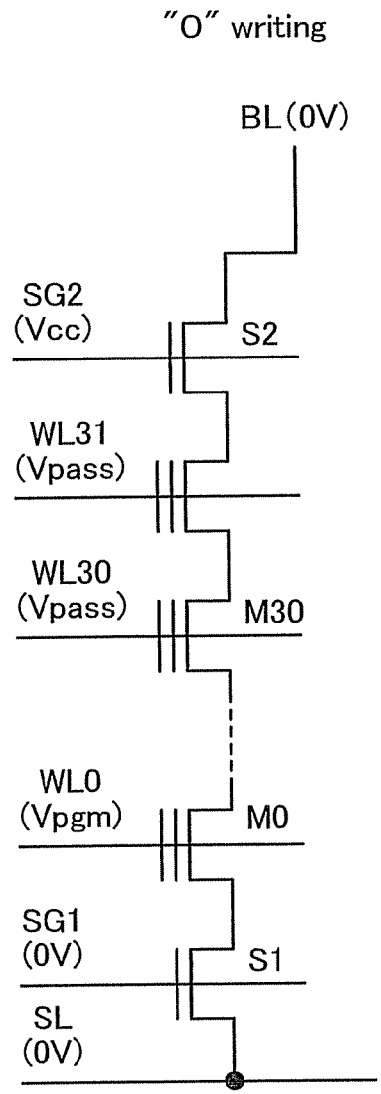
FIGS. 21A and 21B show a writing operation of a NAND-type nonvolatile memory.

As shown in FIG. 21A, in the case where "0" is written, Vcc (a power supply voltage), for example, is applied to a select gate line SG2 to turn a select transistor S2 on, and the bit line BL0 is set to 0 V (ground voltage). Further, the voltage of a select gate line SG1 is set to 0 V and the select transistor S1 is turned off. Next, the voltage of the word line WL0 of the memory cell M0 is set to be a high voltage, Vpgm (approximately 20 V), and the voltage of the other word lines is set to be an intermediate voltage Vpass (approximately 10 V). Since the voltage of the bit line BL is 0 V, the potential of a channel forming region of the selected nonvolatile memory element M0 is 0 V. Because the potential difference between the word line WL0 and the channel forming region is large, electrons are injected into the charge storage layer of the memory cell M0 by F-N tunneling current, as described above. Accordingly, the threshold voltage of the memory cell M0 changes to a positive state (a state in which "0" is written).

Figure 21B:
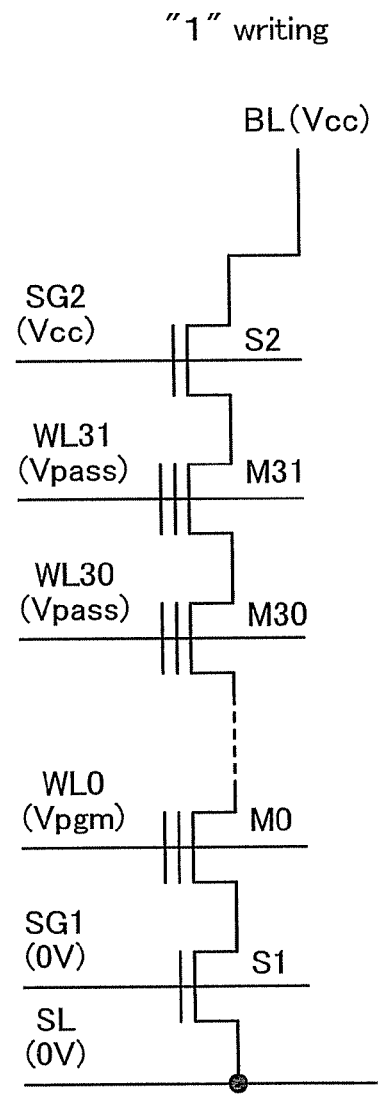

In the case of writing "1", as shown in FIG. 21B, Vcc (a power supply voltage), for example, is applied to the bit line BL. Because the voltage of a select gate line SG2 is Vcc, when the voltage becomes Vcc minus Vth (Vcc−Vth) with respect to the threshold voltage Vth of a select transistor S2, the select transistor S2 is cut off. Therefore, a channel forming region of the memory cell M0 goes into a floating state. Next, when a high voltage Vpgm (20 V) is applied to the word line WL0, and an intermediate voltage Vpass (10 V) is applied to the other word lines, through capacitive coupling of each word line and the channel forming region, the voltage of the channel forming region increases from Vcc to Vth to become, for example, approximately 8 V. Because the voltage of the channel forming region is boosted to a high voltage, a potential difference between the word line WL0 and the channel forming region is small, in contrast to the case where "0" is written. Accordingly, electron injection by F-N tunneling current does not occur in the floating gate of the memory cell M0. Accordingly, a negative state (a state where "1" is written) of the threshold value of the memory element M0 is maintained.

Figure 22A:
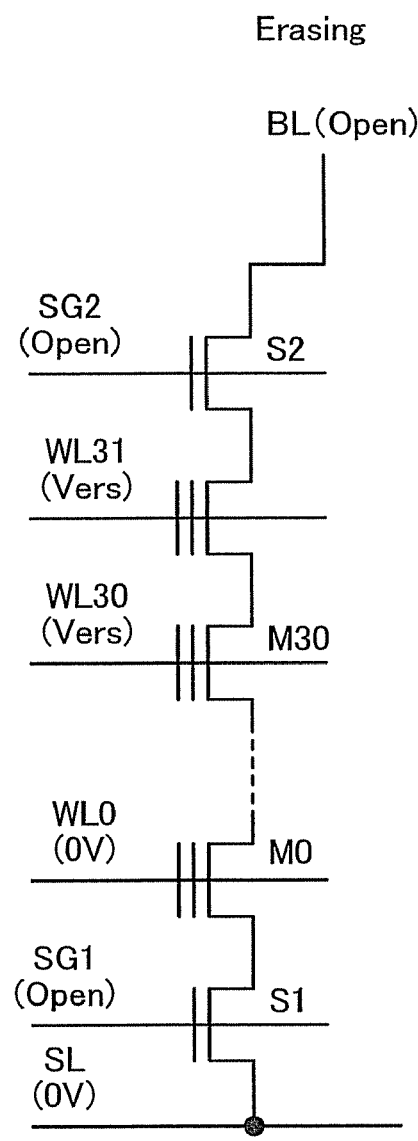
FIGS. 22A and 22B show an erasing operation and a reading operation, respectively, of a NAND-type nonvolatile memory.

When an erasing operation is performed, as shown in FIG. 22A, a high negative voltage (Vers) is applied to all of the word lines in a selected block, and the bit line BL and the source line SL are put in a floating state. Accordingly, electrons in floating gates of all of the memory cells in the block are discharged into the semiconductor layer by tunneling current. As a result, threshold voltages of these memory cells shift to the negative direction.

Figure 22B:
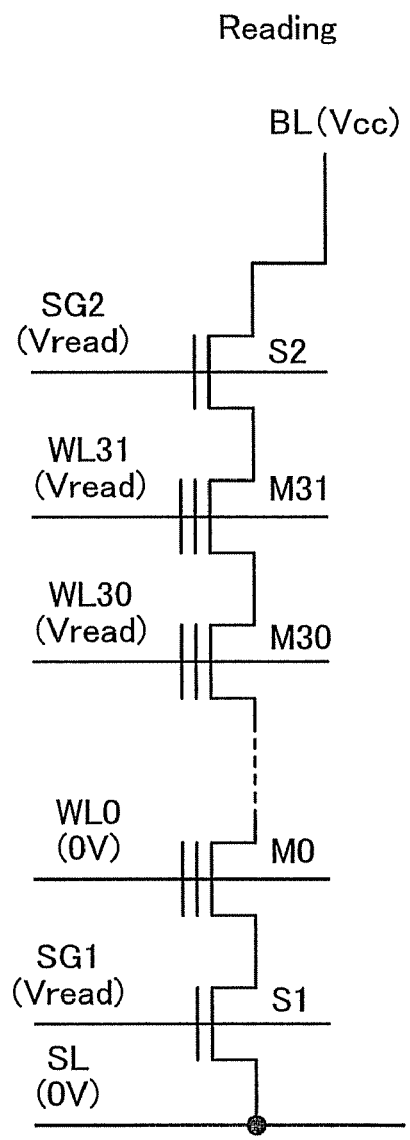
Figure 23:
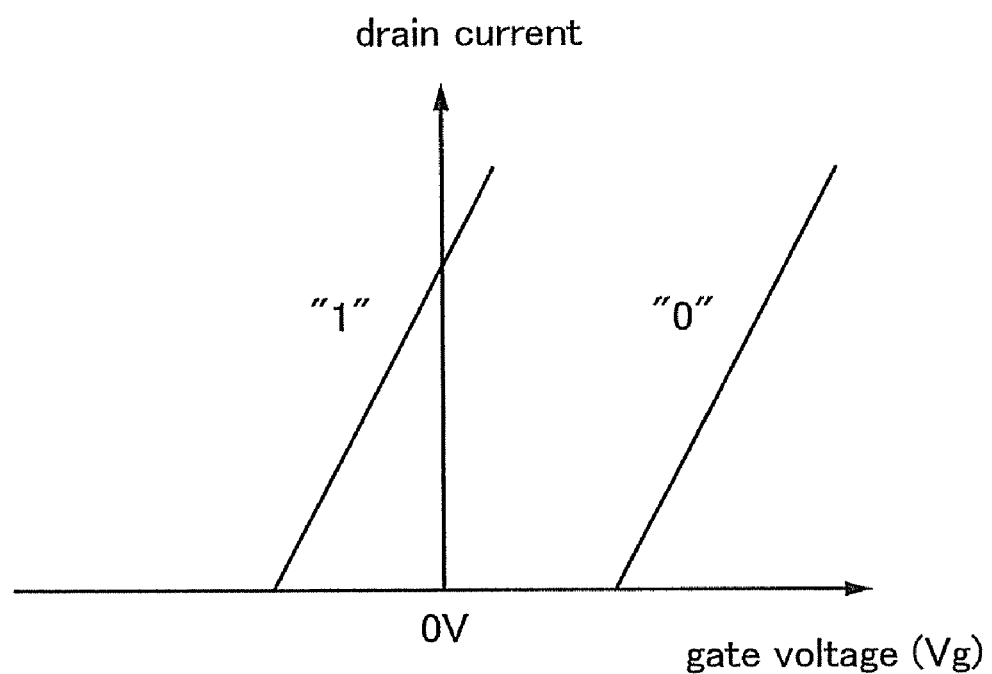
FIG. 23 shows the change in threshold voltage of a nonvolatile memory element between the case of "0", in which charge is stored, and the case of "1", in which charge has been erased.
Figure 24A:
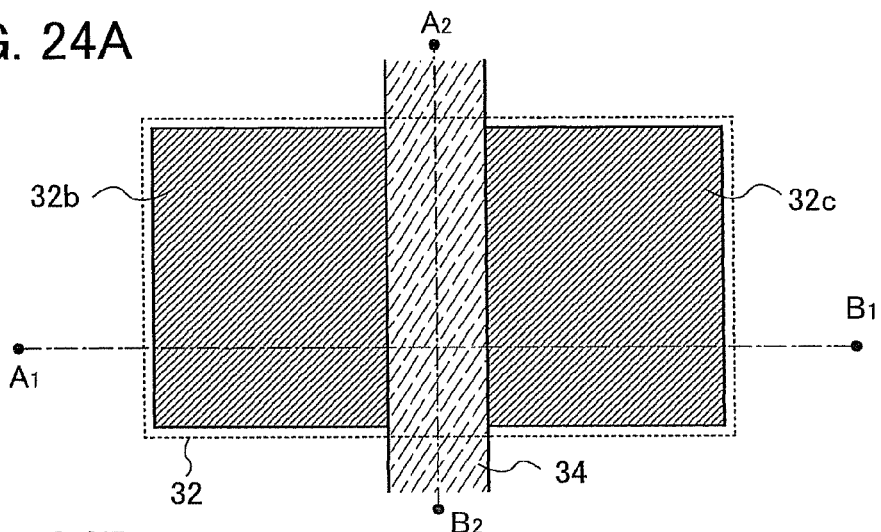
FIGS. 24A to 24D are a top view and cross sections of a structure of a conventional thin film transistor.
Figure 24B:
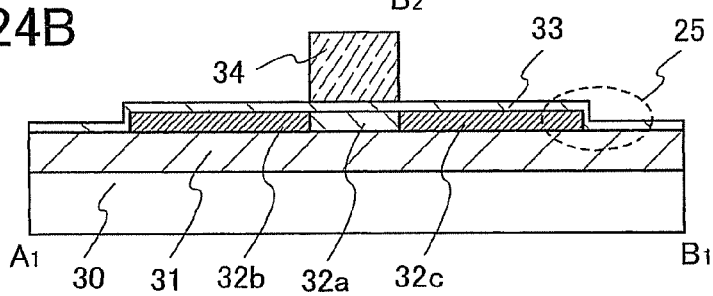
Figure 24C:
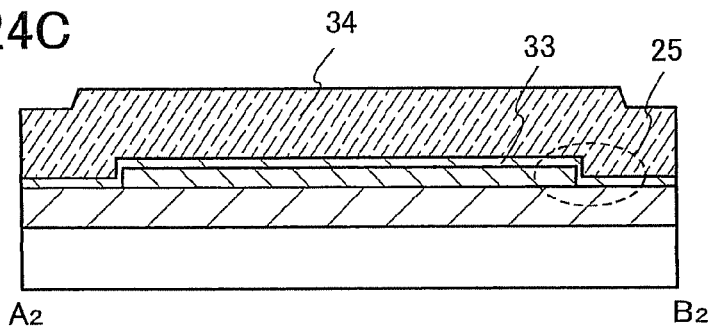
Figure 24D:
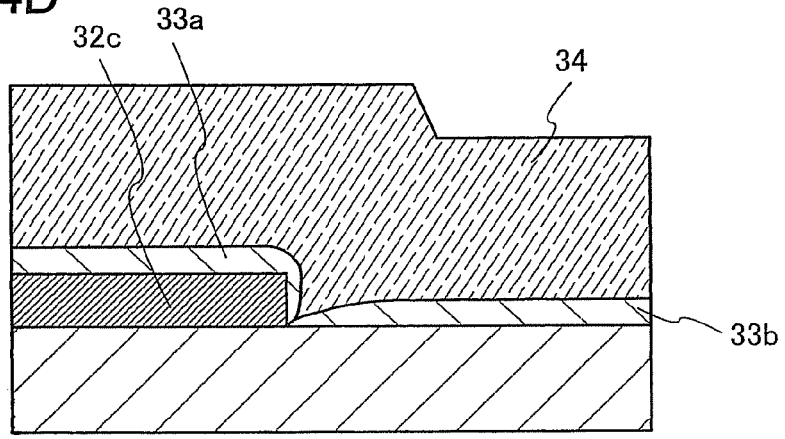

In a reading operation shown in FIG. 22B, a voltage of the word line WL0 of the memory cell M0 selected for reading is set to Vr (e.g., 0 V), and the word lines WL1 to WL31 of unselected memory cells and the select gate lines SG1 and SG2 are set to an intermediate voltage Vread for reading, which is slightly higher than the power supply voltage. That is, as shown in FIG. 23, the memory elements other than the selected memory element function as transfer transistors. In this manner, it is detected whether or not current is flowing through the memory cell M0 selected for reading. That is, when the data stored in the memory cell M30 is "0", the memory cell M0 is off, so the bit line BL does not discharge electricity. On the other hand, in the case where the data stored in the memory cell M30 is "1", the memory cell M0 is turned on, so the bit line BL discharges electricity.

Embodiment Mode 9

In this embodiment mode, an example of a structure of a semiconductor device having the thin film transistor and the nonvolatile memory described in embodiment modes above, which is capable of inputting and outputting data contactlessly, will be described. According to its mode of use, a semiconductor device capable of inputting and outputting data contactlessly may also be referred to as an RFID tag, an ID tag, an IC tag, an IC chip, an RF tag, a wireless tag, an electronic tag, or a wireless chip.

Figure 13A:
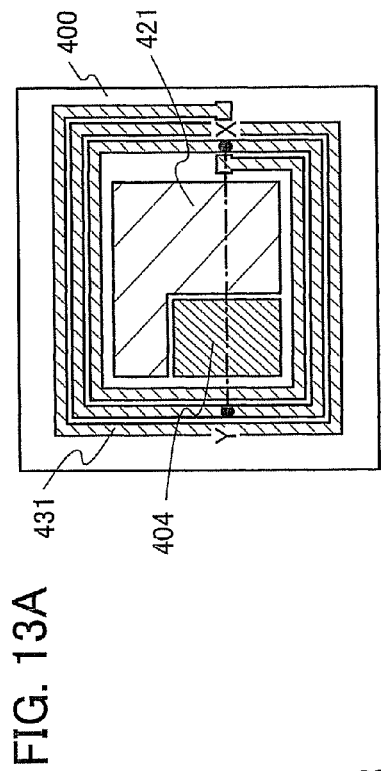
FIGS. 13A and 13B are a top view and a cross section which show a structure of a semiconductor device of the invention.
Figure 13B:
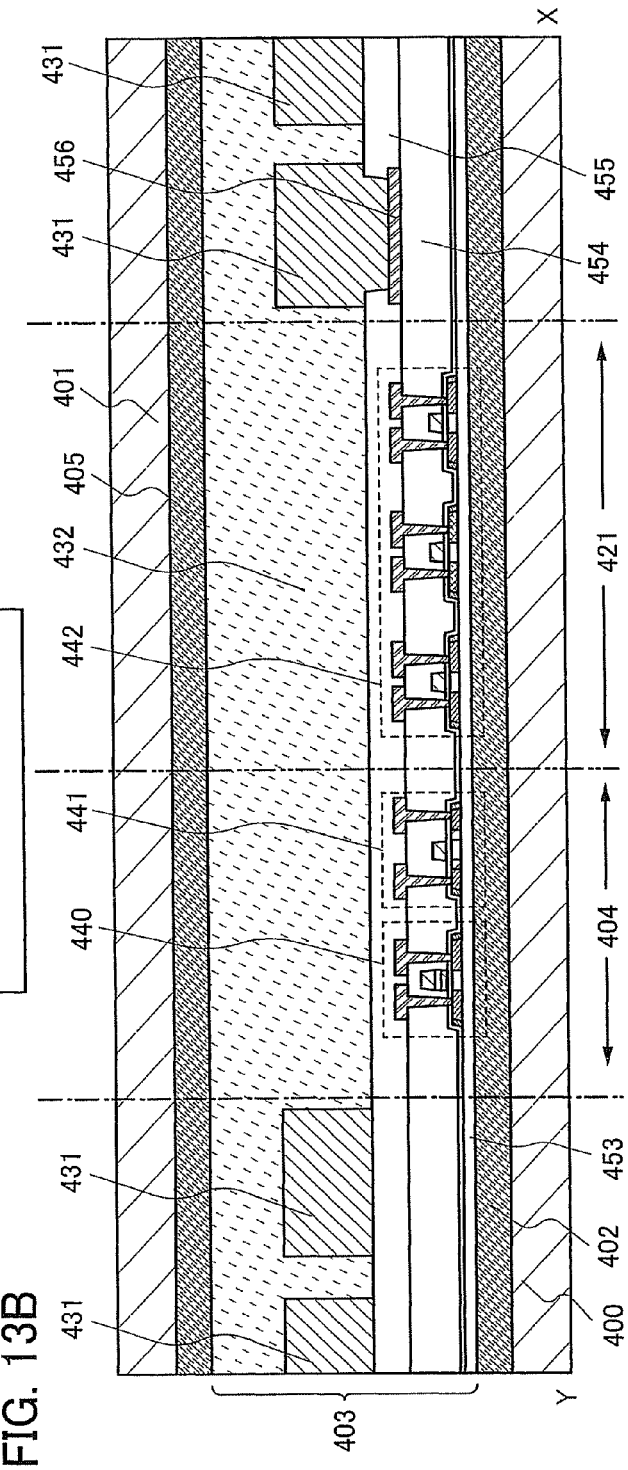

A top view of the semiconductor device of this embodiment mode is shown in FIG. 13A and a cross section taken along the line Y-X in FIG. 13A is shown in FIG. 13B.

As shown in FIG. 13A, in the semiconductor device, a memory circuit 404, an integrated circuit portion 421, and an antenna 431 are provided over a substrate 400. Note that the thin film transistor described in an above embodiment mode can be used to form the memory circuit 404 and the integrated circuit portion 421. Further, the above-described nonvolatile semiconductor memory device can be used to form the memory circuit 404.

As shown in FIG. 13B, in the semiconductor device, an element forming layer 403 is interposed between the substrate 400 and a substrate 401. Further, the element formation layer 403 is firmly fixed to the substrates 400 and 401 by adhesive materials 402 and 405, respectively. An insulating layer 453, a nonvolatile memory element 440, and transistors 441 and 442 are formed in the element formation layer 403. An insulating layer 454 is formed over the nonvolatile memory element 440 and the transistors 441 and 442. A wiring 456 is formed over the insulating layer 454. The antenna 431 is formed over the insulating layer 454 and the wiring 456. An insulating layer 432 is formed over the antenna 431 and an insulating layer 455. In an opening formed in the insulating layer 455, the antenna 431 is connected to the wiring 456 which is formed over the insulating layer 454. The wiring 456 is connected to a high frequency circuit which is part of the integrated circuit portion 421. Further, an example is shown in which the memory circuit 404 includes the nonvolatile memory element 440 and the transistor 441, and the integrated circuit portion 421 includes the transistor 442; however, a resistor, a capacitor, a rectifier, or the like may also be included.

In this embodiment mode, a polyimide layer is used to form the insulating layer 455; a stacked conductive layer including a titanium film, an aluminum film, and another titanium film is used to faun a conductive layer; and a silver base alloy layer formed by a printing method is used as a conductive film to form the antenna 431. The insulating layer 432 is formed to ameliorate unevenness in the antenna 431. Preferably it is formed by applying a composition using an application method, then performing drying and baking. In this embodiment mode, an epoxy resin layer is used to formed the insulating layer 432. A PEN film is used for the substrates 400 and 401, and a thermoplastic resin is used for the adhesive materials 402 and 405.

Note that the antenna 431 may overlap the memory circuit 404, or may have a structure in which it is provided around the memory circuit 404 and does not overlap with the memory circuit 404. In the case where the antenna 431 overlaps with the memory circuit 404, there may be overlap with an entire surface, or a structure in which there is overlap with a portion may be used. When a structure in which the antenna 431 overlaps with the memory circuit 404 is used, the number of malfunctions of a semiconductor device which are caused by noise or the like in a signal when the antenna 431 is communicating, variations in electromotive force which occur due to electromagnetic induction, or the like can be reduced, and reliability can be improved. Further, miniaturization of the semiconductor device can be achieved.

As a method of transmitting a signal for the above-described semiconductor device which is capable of inputting and outputting data contactlessly, an electromagnetic coupling method, an electromagnetic induction method, a microwave method, or the like can be used. Preferably, a practitioner of the invention selects a transmission method as appropriate taking an intended use of the device into account, and an antenna which is suitable for the transmission method is provided.

For example, when an electromagnetic coupling method or an electromagnetic induction method (e.g., employing the 13.56 MHz band) is used as the signal transmission method of the semiconductor device, a conductive layer which serves as the antenna 431 is formed with an annular form (e.g., a loop antenna) or a helical form (e.g., a spiral antenna) in order to utilize electromagnetic induction which occurs with changes in magnetic field density.

As a signal transmission method for the semiconductor device, in the case of employing a microwave method (for example, using a UHF band (an 860 to 960 MHz band), a 2.45 GHz band, or the like), the form, such as the length, of a conductive film which serves as the antenna 431 may be decided as appropriate taking the wavelength of an electromagnetic wave used for signal transmission into account. For example, a conductive layer which serves as the antenna 431 can be formed with a linear shape (e.g., as a dipole antenna), a flat shape (e.g., as a patch antenna), a ribbon shape, or the like. Further, the form of a conductive layer which serves as the antenna 431 is not limited to a linear fault. Taking the wavelength of an electromagnetic wave into consideration, the conductive layer may be given a curved form, a meandering form, or a combination of such forms.

A conductive layer which serves as the antenna 431 is formed of a conductive material using a CVD method, a sputtering method, a printing method such as screen printing or gravure printing, a droplet discharging method, a dispenser method, a plating method, or the like. The conductive material is formed as a single layer structure or a stacked layer structure including any of the elements aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material that includes any of those elements as a main component.

For example, in the case of using a screen printing method to form a conductive film which serves as the antenna 431, the conductive film can be provided by selectively printing a conductive paste in which conductive particles having a grain size of several nm to several tens of μm are dissolved or dispersed in an organic resin, and then drying and baking the paste. As the conductive particles, metal particles of one or more of any of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersive nanoparticles can be used. Further, as an organic resin included in the conductive paste, one or more organic resins which function as a binder, a solvent, a dispersing agent, or a coating material for the metal particles can be used. Organic resins such as an epoxy resin or a silicone resin can be given as representative examples. Further, as alternatives to the above-mentioned materials, ceramic, ferrite, or the like may be used for an antenna.

In the case of using an electromagnetic coupling method or an electromagnetic induction method, and providing a semiconductor device including an antenna in contact with metal, a magnetic material having magnetic permeability is preferably provided between the semiconductor device and the metal. In the case of providing a semiconductor device including an antenna in contact with metal, an eddy current flows in the metal due to change in a magnetic field, and a demagnetizing field generated by the eddy current impairs the change in a magnetic field, so a communication range is decreased. By providing a material having magnetic permeability between the semiconductor device and the metal, an eddy current of the metal can be suppressed and a decrease in the communication range can be suppressed. Note that ferrite or a metal thin film having high magnetic permeability and little loss of high frequency waves can be used as the magnetic material.

In this embodiment mode, a semiconductor device in which a semiconductor element, such as a transistor or the like, and a conductive layer which serves as an antenna are directly formed in the element formation layer is described; however, the structure of the semiconductor device is not limited to this. For example, a semiconductor element and a conductive layer which serves as an antenna may be provided over separate substrates, and the substrates may then be attached to each other so that the semiconductor element and the conductive layer which serves as the antenna are electrically connected to each other.

According to the invention, a highly reliable semiconductor device which employs an element in which leakage current between a semiconductor layer and a gate electrode is suppressed can be manufactured.

Figure 14:
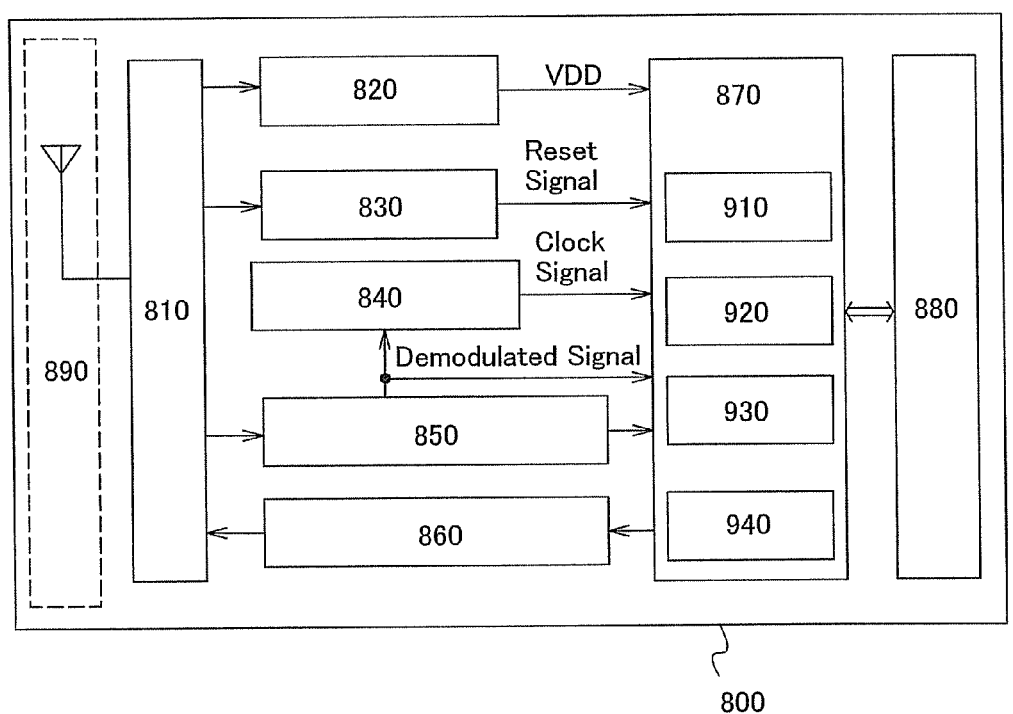
FIG. 14 is a block diagram which shows a structure of a semiconductor device of the invention.

FIG. 14 shows a block diagram of a semiconductor device which is capable of inputting and outputting data contactlessly. A semiconductor device 800 which is capable of inputting and outputting data contactlessly has a function of communicating data contactlessly, and includes a high-frequency circuit 810, a power supply circuit 820, a reset circuit 830, a clock generating circuit 840, a data demodulating circuit 850, a data modulating circuit 860, a control circuit 870 which controls another circuit, a memory circuit 880, and an antenna 890. Note that the memory circuit 880 shown in FIG. 14 corresponds to the memory circuit 404 shown in FIGS. 13A and 13B. Further, the high-frequency circuit 810, the power supply circuit 820, the reset circuit 830, the clock generating circuit 840, the data demodulating circuit 850, the data modulating circuit 860, and the control circuit 870 shown in FIG. 14 correspond to the integrated circuit portion 421 shown in FIG. 13. Further, the antenna 890 shown in FIG. 14 corresponds to the antenna 431 shown in FIG. 13.

The high-frequency circuit 810 is a circuit which receives a signal from the antenna 890, and outputs a signal, which is received from the data modulating circuit 860, from the antenna 890. The power supply circuit 820 is a circuit which generates a power supply potential from a receive signal. The reset circuit 830 is a circuit which generates a reset signal. The clock generating circuit 840 is a circuit which generates various clock signals based on a receive signal input from the antenna 890. The data demodulating circuit 850 is a circuit which demodulates a receive signal and outputs the demodulated signal to the control circuit 870. The data modulating circuit 860 is a circuit which modulates a signal received from the control circuit 870. Further, as the control circuit 870, a code extraction circuit 910, a code determination circuit 920, a CRC determination circuit 930, and an output unit circuit 940 are provided, for example. The code extracting circuit 910 is a circuit which extracts each of a plurality of codes included in an instruction transmitted to the control circuit 870. The code determination circuit 920 is a circuit which determines the content of an instruction by comparing an extracted code with a code which corresponds to a reference. The CRC determination circuit 930 is a circuit which detects the presence of transmission errors and the like based on a determined code.

Next, an example of an operation of the above-mentioned semiconductor device will be described. First, a radio signal is received by the antenna 890. The radio signal is transmitted to the power supply circuit 820 via the high-frequency circuit 810, and a high power supply potential (hereinafter referred to as VDD) is generated. The VDD is supplied to circuits included in the semiconductor device 800. A signal transmitted to the data demodulating circuit 850 via the high-frequency circuit 810 is demodulated (hereinafter, this signal is referred to as a demodulated signal). Further, signals that have passed through the reset circuit 830 and the clock generating circuit 840 via the high-frequency circuit 810, and the demodulated signal are transmitted to the control circuit 870. The signals transmitted to the control circuit 870 are analyzed by the code extracting circuit 910, the code determination circuit 920, the CRC determination circuit 930, and the like. Then, based on the analyzed signals, information in the semiconductor device stored in the memory circuit 880 is outputted. The outputted information of the semiconductor device passes through the output unit circuit 940 and is encoded. Further, the encoded information of the semiconductor device 800 passes through the data modulating circuit 860 and is superposed on a radio signal and transmitted by the antenna 890. Note that a low power supply potential (hereinafter referred to as VSS) is common in the plurality of circuits included in the semiconductor device 800, and GND can be used as VSS. Further, the high frequency circuit 810, the power supply circuit 820, the reset circuit 830, the clock generating circuit 840, the data demodulation circuit 850, the data modulation circuit 860, the control circuit 870 for controlling another circuit, the memory circuit 880, and the like can be formed using an above-described semiconductor element; representatively, the thin film transistor. Further, the above-described nonvolatile semiconductor memory device can be applied to the memory circuit 880. Since a driving voltage of a semiconductor device of the invention can be reduced, the distance across which data can be communicated contactlessly can be increased.

When a signal is transmitted from a reader/writer to the semiconductor device 800 and a signal transmitted from the semiconductor device 800 is received by the reader/writer in this manner, data in the semiconductor device can be read.

Further, the semiconductor device 800 may be one in which a power source (e.g., a battery) is not included and a power supply voltage is supplied to circuits by using electromagnetic waves. The semiconductor device 800 may also be one in which a power source (e.g., a battery) is included, and a power supply voltage is supplied to circuits by using both electromagnetic waves and the power source (battery).

Figure 15A:
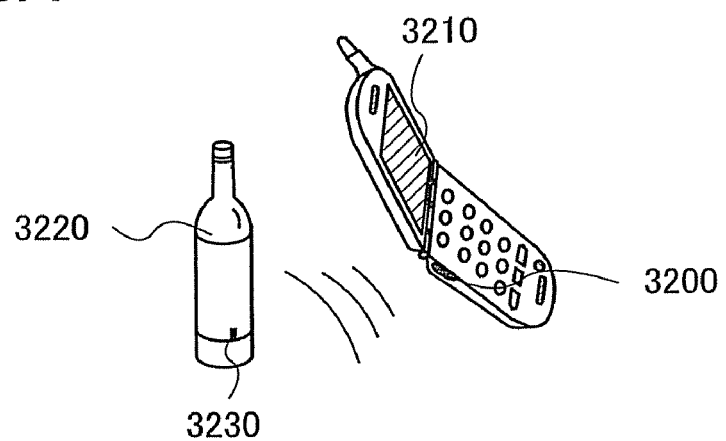
FIGS. 15A and 15B show usage modes of a semiconductor device of the invention.
Figure 15B:
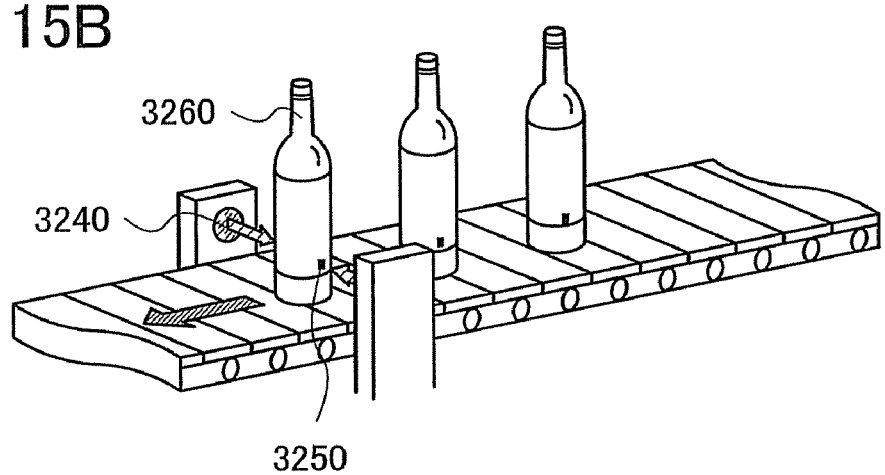

Next, an example of a mode of use of a semiconductor device capable of inputting and outputting data contactlessly will be described. A side surface of a mobile terminal which includes a display portion 3210 is provided with a reader/writer 3200. A side surface of a product 3220 is provided with a semiconductor device 3230 (FIG. 15A). When the reader/writer 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a reader/writer 3240 and a semiconductor device 3250 with which the product 3260 is provided (FIG. 15B). When the semiconductor device is used in a system in this manner, information can be obtained easily, and higher performance and higher added value are achieved.

Further, the nonvolatile semiconductor memory device of the invention can be used in electronic devices which include a memory in all kinds of fields. For example, an electronic device to which the nonvolatile semiconductor memory device of the invention is applied may be a video camera, a digital camera, a goggle-type display (a head-mounted display), a navigation system, a sound reproducing device (e.g., a car audio device or an audio component), a computer, a game machine, a portable information terminal (e.g., a mobile computer, a portable telephone, a portable game machine, or an electronic book), an image reproducing device which includes a recording medium (specifically, a device which plays back a recording medium, such as a DVD (digital versatile disc), and has a display which can display the images), or the like. Specific examples of these electronic devices are shown in FIGS. 16A to 16E.

Figure 16A:
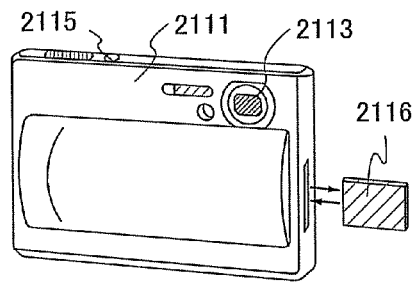
FIGS. 16A to 16E show usage modes of a semiconductor device of the invention.
Figure 16B:
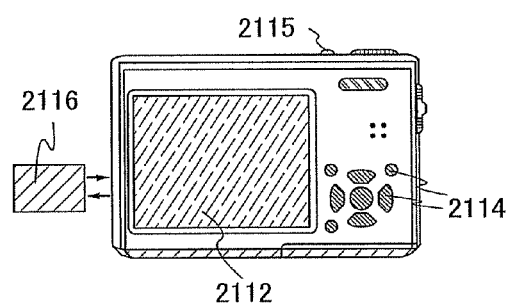

FIGS. 16A and 16B show a digital camera. FIG. 16B is a view of the back side of FIG. 16A. The digital camera includes a housing 2111, a display portion 2112, a lens 2113, operating keys 2114, a shutter release button 2115, and the like. Further, the digital camera includes a removable nonvolatile memory 2116 in which data photographed using the digital camera is stored. A nonvolatile semiconductor memory device formed using the invention can be applied to the memory 2116.

Figure 16C:
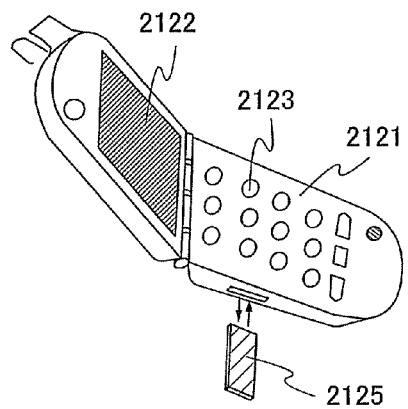

FIG. 16C shows a portable telephone, which is a representative example of a portable terminal. The portable telephone includes a housing 2121, a display portion 2122, operation keys 2123, and the like. Further, the portable telephone includes a removable nonvolatile memory 2125. Data such as the telephone number of the portable telephone and the like, images, music data, and the like can be stored in the memory 2125 and reproduced. A nonvolatile semiconductor memory device formed using the invention can be applied to the memory 2125.

Figure 16D:
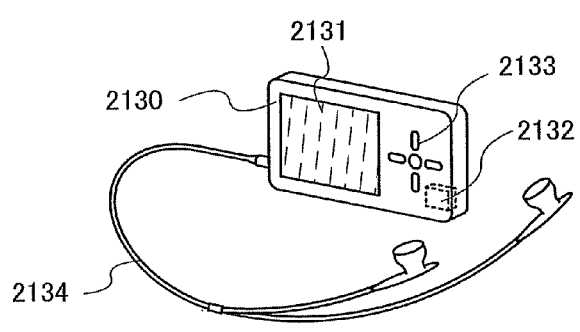

Further, FIG. 16D shows a digital player, which is a representative example of an audio device. The digital player shown in FIG. 16D includes a main body 2130, a display portion 2131, a memory portion 2132, an operating portion 2133, earphones 2134, and the like. Note that headphones or wireless earphones can be used instead of the earphones 2134. A nonvolatile semiconductor memory device formed using the invention can be used for the memory portion 2132. For example, when a NAND-type nonvolatile memory with a memory capacity of 20 to 200 gigabytes (GB) is used and the operating portion 2133 is operated, images and sound (e.g., music) can be stored and reproduced. Note that when white characters are display on a black background in the display portion 2131, power consumption can be suppressed. This is particularly effective in a portable audio device. Note that a nonvolatile semiconductor memory device which is provided in the memory portion 2132 may be removable.

Figure 16E:
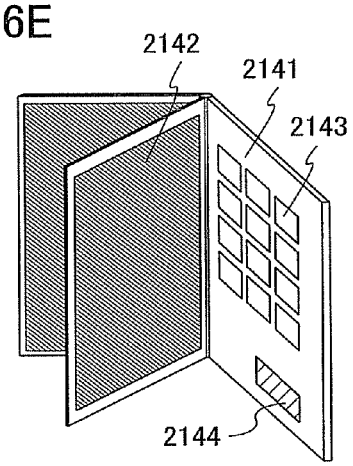

Further, FIG. 16E shows an electronic book (also referred to as electronic paper). The electronic book includes a main body 2141, a display portion 2142, operation keys 2143, and a memory portion 2144. A modem may be built into the main body 2141, or a structure in which information can be transmitted and received wirelessly may be employed. A nonvolatile semiconductor memory device formed using the invention can be used for the memory portion 2144. For example, when a NAND-type nonvolatile memory with a memory capacity of 20 to 200 gigabytes (GB) is used and the operating keys 2143 are operated, images and sound (e.g., music) can be stored and reproduced. Note that a nonvolatile semiconductor memory device which is provided in the memory portion 2144 may be removable.

Thus, a nonvolatile semiconductor memory device of the invention has a very wide range of application, and can be used in electronic devices which include a memory portion in all kinds of fields.

The present application is based on Japanese Patent Application Serial No. 2006-328015 filed on Dec. 5, 2006 with the Japanese Patent Office, the entire contents of which are hereby incorporated by reference.

What is claimed is:
1. A semiconductor device, comprising:
a semiconductor layer formed over a substrate;
a first insulating layer formed only on a side surface of the semiconductor layer, the first insulating layer surrounding the semiconductor layer;
a second insulating layer comprising $H_f$ formed over and in contact with the semiconductor layer and the first insulating layer;
a gate electrode formed over the second insulating layer comprising $H_f$, the gate electrode overlapping with the semiconductor layer and the first insulating layer;
a source electrode over the second insulating layer; and
a drain electrode over the second insulating layer, wherein the source electrode is in contact with the semiconductor layer and the second insulating layer, and
wherein the drain electrode is in contact with the semiconductor layer and the second insulating layer.

2. The semiconductor device according to claim 1, wherein the semiconductor layer is a single crystal semiconductor.

3. The semiconductor device according to claim 1, wherein the semiconductor layer includes silicon.

4. The semiconductor device according to claim 1, wherein the semiconductor layer includes single crystal silicon germanium.

5. A semiconductor device, comprising:
a semiconductor layer formed over a substrate;
a first insulating layer formed only on a side surface of the semiconductor layer, the first insulating layer surrounding the semiconductor layer;
a second insulating layer comprising $H_f$ formed over and in contact with the semiconductor layer and the first insulating layer;
a gate electrode formed over the second insulating layer comprising $H_f$, the gate electrode overlapping with the semiconductor layer and the first insulating layer;
a third insulating layer formed over the gate electrode;
a conductive layer over the third insulating layer, the conductive layer being electrically connected to the semiconductor layer;
a source electrode over the third insulating layer; and
a drain electrode over the third insulating layer,
wherein the source electrode is in contact with the semiconductor layer and the second insulating layer,
wherein the drain electrode is in contact with the semiconductor layer and the second insulating layer, and
wherein the conductive layer overlaps with the first insulating layer.

6. The semiconductor device according to claim 5, wherein the semiconductor layer is a single crystal semiconductor.

7. The semiconductor device according to claim 5, wherein the semiconductor layer includes silicon.

8. The semiconductor device according to claim 5, wherein the semiconductor layer includes single crystal silicon germanium.

9. A semiconductor device, comprising:
a semiconductor layer formed over a substrate;
a first insulating layer formed on a side surface of the semiconductor layer;
a second insulating layer comprising $H_f$ formed over and in contact with the semiconductor layer, the substrate and the first insulating layer;
a charge storage layer over the semiconductor layer with the second insulating layer comprising $H_f$ interposed therebetween;
a third insulating layer over the charge storage layer; and
a gate electrode formed over the third insulating layer, the gate electrode overlapping with the charge storage layer.

10. The semiconductor device according to claim 9, wherein the semiconductor layer is a single crystal semiconductor.

11. The semiconductor device according to claim 9, wherein the semiconductor layer includes silicon.

12. The semiconductor device according to claim 9, wherein the semiconductor layer includes single crystal silicon germanium.

* * * * *

UNITED STATES PATENT AND TRADEMARK OFFICE
CERTIFICATE OF CORRECTION

| | | |
|---|---|---|
| PATENT NO. | : 8,283,669 B2 | |
| APPLICATION NO. | : 12/963883 | |
| DATED | : October 9, 2012 | |
| INVENTOR(S) | : Hideto Ohnuma | |

It is certified that error appears in the above-identified patent and that said Letters Patent is hereby corrected as shown below:

In the Specification:

Column 2, Line 27; Change "Mulling" to --forming--.

Column 15, Line 9; Change "channel faulting region" to --channel forming region--.

Column 18, Line 44; Change "to faun" to --to form--.

Column 19, Line 37; Change "selectively fainted" to --selectively formed--.

Column 21, Line 10; Change "which is farmed" to --which is formed--.

Column 26, Line 20; Change "to faun" to --to form--.

Column 26, Line 26; Change "to formed" to --to form--.

Column 27, Line 5; Change "a linear fault" to --a linear form--.

Signed and Sealed this
Fifth Day of February, 2013

Teresa Stanek Rea
*Acting Director of the United States Patent and Trademark Office*